United States Patent
Solomon et al.

(10) Patent No.: US 7,532,537 B2
(45) Date of Patent: May 12, 2009

(54) MEMORY MODULE WITH A CIRCUIT PROVIDING LOAD ISOLATION AND MEMORY DOMAIN TRANSLATION

(75) Inventors: Jeffrey C. Solomon, Irvine, CA (US); Jayesh R. Bhakta, Cerritos, CA (US)

(73) Assignee: Netlist, Inc., Irvine, CA (US)

( * ) Notice: Subject to any disclaimer, the term of this patent is extended or adjusted under 35 U.S.C. 154(b) by 170 days.

(21) Appl. No.: 11/335,875

(22) Filed: Jan. 19, 2006

(65) Prior Publication Data

US 2006/0262586 A1    Nov. 23, 2006

Related U.S. Application Data

(63) Continuation-in-part of application No. 11/173,175, filed on Jul. 1, 2005, now Pat. No. 7,289,386, which is a continuation-in-part of application No. 11/075,395, filed on Mar. 7, 2005, now Pat. No. 7,286,436.

(60) Provisional application No. 60/645,087, filed on Jan. 19, 2005, provisional application No. 60/588,244, filed on Jul. 15, 2004, provisional application No. 60/550,668, filed on Mar. 5, 2004, provisional application No. 60/575,595, filed on May 28, 2004, provisional application No. 60/590,038, filed on Jul. 21, 2004.

(51) Int. Cl.
    *G11C 8/00* (2006.01)
(52) U.S. Cl. ............... 365/230.06; 365/51; 365/233.13
(58) Field of Classification Search ............ 365/51, 365/52, 191, 230.03, 230.06, 230.08, 233.1, 365/233.13
See application file for complete search history.

(56) References Cited

U.S. PATENT DOCUMENTS

| | | | |
|---|---|---|---|
| 4,392,212 A | 7/1983 | Miyasaka et al. |
| 5,247,643 A | 9/1993 | Shottan |
| 5,426,753 A | 6/1995 | Moon |
| 5,581,498 A | 12/1996 | Ludwig et al. |
| 5,703,826 A | 12/1997 | Hush et al. |
| 5,745,914 A | 4/1998 | Connolly et al. |
| 5,802,395 A | 9/1998 | Connolly et al. |
| 5,805,520 A | 9/1998 | Anglada et al. |
| 5,926,827 A | 7/1999 | Dell et al. |

(Continued)

OTHER PUBLICATIONS

Barr, Michael. "Programmable Logic: What's it To Ya?," Embedded Systems Programming, Jun. 1999, pp. 75-84. Retrieved by Examiner from http://www.netrino.com/Articles/ProgrammableLogic/index.php.*

(Continued)

*Primary Examiner*—Van Thu Nguyen
*Assistant Examiner*—Alexander Sofocleous
(74) *Attorney, Agent, or Firm*—Knobbe, Martens, Olson & Bear, LLP

(57) ABSTRACT

A memory module includes a plurality of memory devices and a circuit. Each memory device has a corresponding load. The circuit is electrically coupled to the plurality of memory devices and is configured to be electrically coupled to a memory controller of a computer system. The circuit selectively isolates one or more of the loads of the memory devices from the computer system. The circuit comprises logic which translates between a system memory domain of the computer system and a physical memory domain of the memory module.

44 Claims, 23 Drawing Sheets

U.S. PATENT DOCUMENTS

| | | | |
|---|---|---|---|
| 6,070,217 | A | 5/2000 | Connolly et al. |
| 6,154,418 | A | 11/2000 | Li |
| 6,226,709 | B1 | 5/2001 | Goodwin et al. |
| 6,453,381 | B1 | 9/2002 | Yuan et al. |
| 6,518,794 | B2 * | 2/2003 | Coteus et al. .................. 326/93 |
| 6,553,450 | B1 | 4/2003 | Dodd et al. |
| 6,681,301 | B1 | 1/2004 | Mehta et al. |
| 6,742,098 | B1 * | 5/2004 | Halbert et al. ............... 711/172 |
| 6,785,189 | B2 | 8/2004 | Jacobs et al. |
| 6,807,125 | B2 | 10/2004 | Coteus et al. |
| 6,813,196 | B2 | 11/2004 | Park et al. |
| 6,944,694 | B2 | 9/2005 | Pax |
| 6,981,089 | B2 | 12/2005 | Dodd |
| 6,982,893 | B2 | 1/2006 | Jakobs |
| 6,996,686 | B2 | 2/2006 | Doblar et al. |
| 7,007,175 | B2 * | 2/2006 | Chang et al. ................. 713/300 |
| 7,120,727 | B2 | 10/2006 | Lee et al. |
| 7,133,972 | B2 * | 11/2006 | Jeddeloh ..................... 711/137 |
| 7,289,386 | B2 * | 10/2007 | Bhakta et al. .......... 365/230.06 |
| 2001/0003198 | A1 | 6/2001 | Wu |
| 2001/0052057 | A1 | 12/2001 | Lai et al. |
| 2002/0088633 | A1 | 7/2002 | Kong et al. |
| 2003/0063514 | A1 | 4/2003 | Faue |
| 2003/0191995 | A1 | 10/2003 | Abrosimov et al. |
| 2003/0210575 | A1 | 11/2003 | Seo et al. |
| 2004/0037158 | A1 | 2/2004 | Coteus et al. |
| 2005/0036378 | A1 | 2/2005 | Kawaguchi et al. |
| 2005/0281096 | A1 | 12/2005 | Bhakta et al. |
| 2006/0117152 | A1 | 6/2006 | Amidi et al. |
| 2006/0126369 | A1 | 6/2006 | Raghuram |
| 2006/0129755 | A1 | 6/2006 | Raghuram |

OTHER PUBLICATIONS

Miles J. Murdocca et al., "Principles of Computer Architecture", Prentice Hall, 2000, pp. 249-251.

"64 & 72 Pin Zip/Simm Sram Module", Jedec, Standard No. 21-C, www.jedec.com/download/search/4_04_01.pdf, Jun. 1997 pp. 4.4.1-1.

"PC2100 and PC1600 DDR SDRAM Registered DIMM Design Specification" Jedec, Standard No. 21-C, Revision 1-3, Jan. 2002, pp. 4.20.4-1.

Cuppu, Vinodh, et al., "A Performance Comparison of Contemporary DRAM Architectures," *IEEE Proceedings of the 26th International Symposium on Computer Architecture*, May 2-4, 1999, Atlanta, Georgia, pp. 1-12.

Jedec Standard No. 21-C, 4.20-2—168 Pin, PC133 SDRAM Registered Design Specification, Revision 1.4, Release 11a, Feb. 2002.

Jedec Standard No. 21-C, 4.20-3—144 Pin. PC133 SDRAM Unbuffered SO-DIMM, Reference Design Specification, Revision 1.02, Release 11, Published Oct. 2003.

Jedec Standard No. 21-C, DDR SDRAM PC2100 and PC1600 DDR SDRAM Registered DIMM Design Specification, Revision 1.3, Release 11b, Jan. 2002.

Jedec Standard No. 21-C, 4.20.5—184 Pin. PC1600/2100 DDR SDRAM Unbuffered DIMM Design Specification, Revision 1.1, Release 11b, Published Apr. 2003.

Jedec Standard No. 21-C, 4.20.6—200 Pin, PC2700/PC2100/PC1600 DDR SDRAM Unbuffered SO-DIMM Reference Design Specification, Revision 1.1, Release 11b, Apr. 26, 2002.

Jedec standard JESD79D, "Double Data Rate (DDR) SDRAM Specification," published Feb. 2004.

Intel Corporation, PC SDRAM Registered DIMM Design Support Document, Revision 1.2, Oct. 1998.

Intel Corporation, 66/100 MHz PC SDRAM 64-Bit Non-ECC/Parity 144 Pin Unbuffered SO-DIMM Specification, Revision 1.0, Feb. 1999.

* cited by examiner

US 7,532,537 B2

MEMORY MODULE WITH A CIRCUIT PROVIDING LOAD ISOLATION AND MEMORY DOMAIN TRANSLATION

CROSS-REFERENCE TO RELATED APPLICATIONS

The present application is a continuation-in-part of U.S. patent application Ser. No. 11/173,175, filed Jul. 1, 2005 now U.S. Pat No. 7,289,386, which claims the benefit of U.S. Provisional Application No. 60/588,244, filed Jul. 15, 2004 and which is a continuation-in-part of U.S. patent application Ser. No. 11/075,395, filed Mar. 7, 2005 now U.S. Pat No. 7,283,436, which claims the benefit of U.S. Provisional Application No. 60/550,668, filed Mar. 5, 2004, U.S. Provisional Application No. 60/575,595, filed May 28, 2004, and U.S. Provisional Application No. 60/590,038, filed Jul. 21, 2004. U.S. patent application Ser. Nos. 11/173,175 and 11/075,395, and U.S. Provisional Application Nos. 60/588, 244, 60/550,668, 60/575,595, and 60/590,038 are each incorporated in its entirety by reference herein. The present application also claims the benefit of U.S. Provisional Application No. 60/645,087, filed Jan. 19, 2005, which is incorporated in its entirety by reference herein.

BACKGROUND OF THE INVENTION

1. Field of the Invention

The present invention relates generally to memory modules of a computer system, and more specifically to devices and methods for improving the performance, the memory capacity, or both, of memory modules.

2. Description of the Related Art

Certain types of memory modules comprise a plurality of dynamic random-access memory (DRAM) devices mounted on a printed circuit board (PCB). These memory modules are typically mounted in a memory slot or socket of a computer system (e.g., a server system or a personal computer) and are accessed by the processor of the computer system. Memory modules typically have a memory configuration with a unique combination of rows, columns, and banks which result in a total memory capacity for the memory module.

For example, a 512-Megabyte memory module (termed a "512-MB" memory module, which actually has $2^{29}$ or 536,870,912 bytes of capacity) will typically utilize eight 512-Megabit DRAM devices (each identified as a "512-Mb" DRAM device, each actually having $2^{29}$ or 536,870,912 bits of capacity). The memory cells (or memory locations) of each 512-Mb DRAM device can be arranged in fourbanks, with each bank having an array of $2^{24}$ (or 16,777,216) memory locations arranged as $2^{13}$ rows and $2^{11}$ columns, and with each memory location having a width of 8 bits. Such DRAM devices with 64M 8-bit-wide memory locations (actually with four banks of $2^{27}$ or 134,217,728 one-bit memory cells arranged to provide a total of $2^{26}$ or 67,108,864 memory locations with 8 bits each) are identified as having a "64M×8" or "64M×8-bit" configuration, or as having a depth of 64M and a bit width of 8. Furthermore, certain commercially-available 512-MB memory modules are termed to have a "64M×8-byte" configuration or a "64M×64-bit" configuration with a depth of 64M and a width of 8 bytes or 64 bits.

Similarly, a 1-Gigabyte memory module (termed a "1-GB" memory module, which actually has $2^{30}$ or 1,073,741,824 bytes of capacity) can utilize eight 1-Gigabit DRAM devices (each identified as a "1-Gb" DRAM device, each actually having $2^{30}$ or 1,073,741,824 bits of capacity). The memory locations of each 1-Gb DRAM device can be arranged in four banks, with each bank having an array of memory locations with $2^{14}$ rows and $2^{11}$ columns, and with each memory location having a width of 8 bits. Such DRAM devices with 128M 8-bit-wide memory locations (actually with a total of $2^{27}$ or 134,217,728 memory locations with 8 bits each) are identified as having a "128 Mb×8" or "128M×8-bit" configuration, or as having a depth of 128M and a bit width of 8. Furthermore, certain commercially-available 1-GB memory modules are identified as having a "128M×8-byte" configuration or a "128M×64-bit" configuration with a depth of 128M and a width of 8 bytes or 64 bits.

The commercially-available 512-MB (64M×8-byte) memory modules and the 1-GB (128M×8-byte) memory modules described above are typically used in computer systems (e.g., personal computers) which perform graphics applications since such "×8" configurations are compatible with data mask capabilities often used in such graphics applications. Conversely, memory modules with "×4" configurations are typically used in computer systems such as servers which are not as graphics-intensive. Examples of such commercially available "×4" memory modules include, but are not limited to, 512-MB (128M×4-byte) memory modules comprising eight 512-Mb (128 Mb×4) memory devices.

The DRAM devices of a memory module are generally arranged as ranks or rows of memory, each rank of memory generally having a bit width. For example, a memory module in which each rank of the memory module is 64 bits wide is described as having an "×64" organization. Similarly, a memory module having 72-bit-wide ranks is described as having an "×72" organization.

The memory capacity of a memory module increases with the number of memory devices. The number of memory devices of a memory module can be increased by increasing the number of memory devices per rank or by increasing the number of ranks. For example, a memory module with four ranks has double the memory capacity of a memory module with two ranks and four times the memory capacity of a memory module with one rank. Rather than referring to the memory capacity of the memory module, in certain circumstances, the memory density of the memory module is referred to instead.

During operation, the ranks of a memory module are selected or activated by address and command signals that are received from the processor. Examples of such address and command signals include, but are not limited to, rank-select signals, also called chip-select signals. Most computer and server systems support one-rank and two-rank memory modules. By only supporting one-rank and two-rank memory modules, the memory density that can be incorporated in each memory slot is limited.

Various aspects of the design of a memory module impose limitations on the size of the memory arrays of the memory module. Certain such aspects are particularly important for memory modules designed to operate at higher frequencies. Examples of such aspects include, but are not limited to, memory device (e.g., chip) densities, load fan-out, signal integrity, available rank selects, power dissipation, and thermal profiles.

SUMMARY OF THE INVENTION

In certain embodiments, a memory module comprises a plurality of memory devices and a circuit. Each memory device has a corresponding load. The circuit is electrically coupled to the plurality of memory devices and is configured to be electrically coupled to a memory controller of a computer system. The circuit selectively isolates one or more of the loads of the memory devices from the computer system. The circuit comprises logic which translates between a system memory domain of the computer system and a physical memory domain of the memory module.

In certain embodiments, a method of using a memory module with a computer system is provided. The method comprises providing a memory module having a plurality of memory devices and a circuit. The circuit is electrically coupled to the plurality of memory devices. The circuit is configured to be electrically coupled to a computer system. Each memory device has a corresponding load. The method further comprises electrically coupling the memory module to the computer system. The method further comprises activating the circuit to selectively isolate at least one of the loads of the memory devices from the computer system and to translate between a system memory domain of the computer system and a physical memory domain of the memory module.

In certain embodiments, a memory module is connectable to a computer system. The memory module comprises a first memory device having a first data signal line and a first data strobe signal line. The memory module further comprises a second memory device having a second data signal line and a second data strobe signal line. The memory module further comprises a common data signal line connectable to the computer system. The memory module further comprises a device electrically coupled to the first data signal line, to the second data signal line, and to the common data signal line. The device selectively electrically couples the first data signal line to the common data signal line and selectively electrically couples the second data signal line to the common data signal line. The device comprises logic which translates between a system memory domain of the computer system and a physical memory domain of the memory module.

DETAILED DESCRIPTION OF EXAMPLE EMBODIMENTS

Load Isolation

Figure 1:
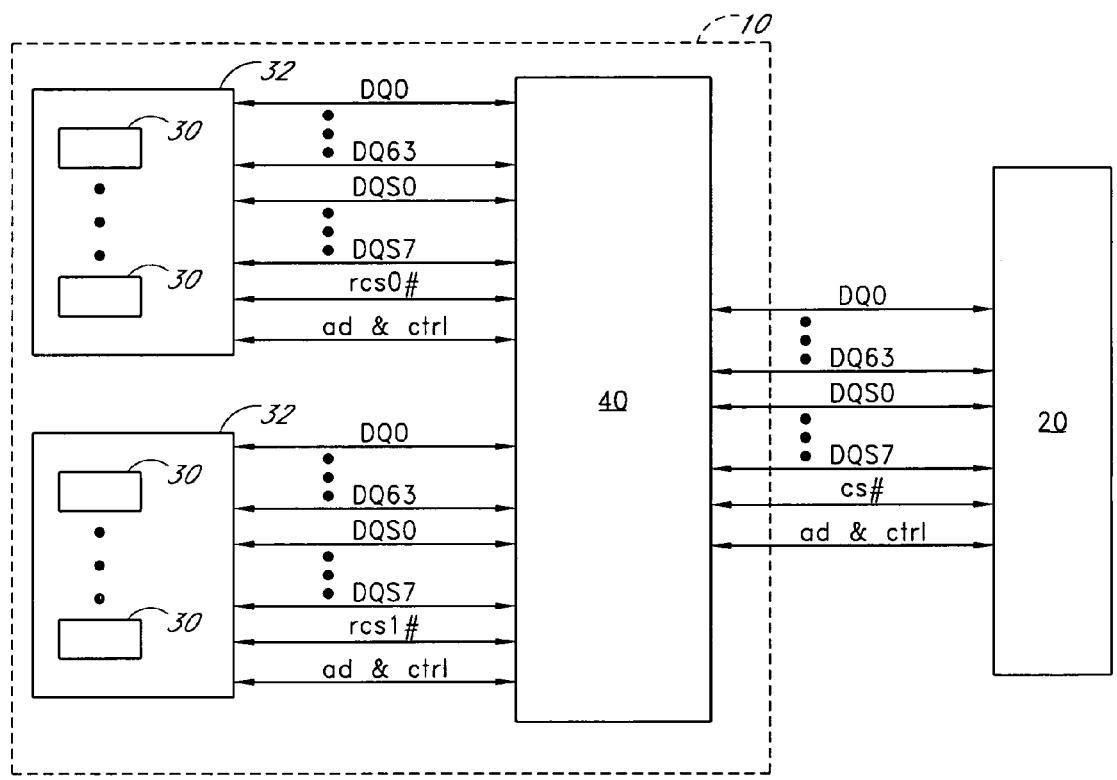
FIG. 1 schematically illustrates an example memory module in accordance with certain embodiments described herein.

FIG. 1 schematically illustrates an example memory module 10 compatible with certain embodiments described herein. The memory module 10 is connectable to a memory controller 20 of a computer system (not shown). The memory module 10 comprises a plurality of memory devices 30, each memory device 30 having a corresponding load. The memory module 10 further comprises a circuit 40 electrically coupled to the plurality of memory devices 30 and configured to be electrically coupled to the memory controller 20 of the computer system. The circuit 40 selectively isolates one or more of the loads of the memory devices from the computer system. The circuit 40 comprises logic which translates between a system memory domain of the computer system and a physical memory domain of the memory module 10.

As used herein, the term "load" is a broad term which includes, without limitation, electrical load, such as capacitive load, inductive load, or impedance load. As used herein, the term "isolation" is a broad term which includes, without limitation, electrical separation of one or more components from another component or from one another. As used herein, the term "circuit" is a broad term which includes, without limitation, an electrical component or device, or a configuration of electrical components or devices which are electrically or electromagnetically coupled together (e.g., integrated circuits), to perform specific functions.

Various types of memory modules 10 are compatible with embodiments described herein. For example, memory modules 10 having memory capacities of 512-MB, 1-GB, 2-GB, 4-GB, 8-GB, as well as other capacities, are compatible with embodiments described herein. Certain embodiments described herein are applicable to various frequencies including, but not limited to 100 MHz, 200 MHz, 400 MHz, 800 MHz, and above. In addition, memory modules 10 having widths of 4 bytes, 8 bytes, 16 bytes, 32 bytes, or 32 bits, 64 bits, 128 bits, 256 bits, as well as other widths (in bytes or in bits), are compatible with embodiments described herein. In certain embodiments, the memory module 10 comprises a printed circuit board on which the memory devices 30 are mounted, a plurality of edge connectors configured to be electrically coupled to a corresponding plurality of contacts of a module slot of the computer system, and a plurality of electrical conduits which electrically couple the memory devices 30 to the circuit 40 and which electrically couple the circuit 40 to the edge connectors. Furthermore, memory modules 10 compatible with embodiments described herein include, but are not limited to, single in-line memory modules (SIMMs), dual in-line memory modules (DIMMs), small-outline DIMMs (SO-DIMMs), unbuffered DIMMs (UDIMMs), registered DIMMs (RDIMMs), fully-buffered DIMM (FBDIMM), rank-buffered DIMMs (RBDIMMs), mini-DIMMs, and micro-DIMMs.

Memory devices 30 compatible with embodiments described herein include, but are not limited to, random-access memory (RAM), dynamic random-access memory (DRAM), synchronous DRAM (SDRAM), and double-data-rate DRAM (e.g., SDR, DDR-1, DDR-2, DDR-3). In addition, memory devices 30 having bit widths of 4, 8, 16, 32, as well as other bit widths, are compatible with embodiments described herein. Memory devices 30 compatible with embodiments described herein have packaging which include, but are not limited to, thin small-outline package (TSOP), ball-grid-array (BGA), fine-pitch BGA (FBGA), micro-BGA (μBGA), mini-BGA (mBGA), and chip-scale packaging (CSP). Memory devices 30 compatible with embodiments described herein ale available from a number of sources, including but not limited to, Samsung Semiconductor, Inc. of San Jose, Calif., Infineon Technologies AG of San Jose, Calif., and Micron Technology, Inc. of Boise, Id. Persons skilled in the art can select appropriate memory devices 30 in accordance with certain embodiments described herein.

In certain embodiments, the plurality of memory devices 30 comprises a first number of memory devices 30. In certain such embodiments, the circuit 40 selectively isolates a second number of the memory devices 30 from the computer system, with the second number less than the first number.

In certain embodiments, the plurality of memory devices 30 are arranged in a first number of ranks. For example, in certain embodiments, the memory devices 30 are arranged in two ranks, as schematically illustrated by FIG. 1. In other embodiments, the memory devices 30 are arranged in four ranks. Other numbers of ranks of the memory devices 30 are also compatible with embodiments described herein.

In certain embodiments, the circuit comprises a logic element selected from a group consisting of: a programmable-logic device (PLD), an application-specific integrated circuit (ASIC), a field-programmable gate array (FPGA), a custom-designed semiconductor device, and a complex programmable-logic device (CPLD). In certain embodiments, the logic element of the circuit 40 is a custom device. Sources of logic elements compatible with embodiments described herein include, but are not limited to, Lattice Semiconductor Corporation of Hillsboro, Oreg., Altera Corporation of San Jose, Calif., and Xilinx Incorporated of San Jose, Calif. In certain embodiments, the logic element comprises various discrete electrical elements, while in certain other embodiments, the logic element comprises one or more integrated circuits.

In certain embodiments, the circuit 40 further comprises one or more switches which are operatively coupled to the logic element to receive control signals from the logic element. Examples of switches compatible with certain embodiments described herein include, but are not limited to, field-effect transistor (FET) switches, such as the SN74AUC1G66 single bilateral analog switch available from Texas Instruments, Inc. of Dallas, Tex.

Figure 2:
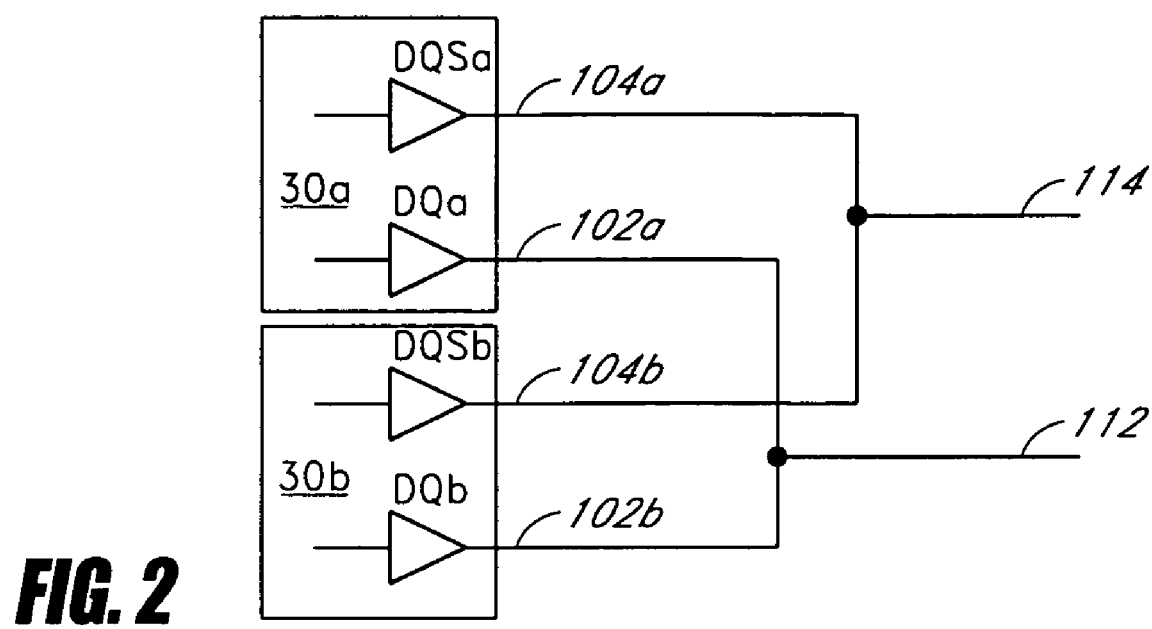
FIG. 2 schematically illustrates a circuit diagram of two memory devices of a conventional memory module.

FIG. 2 schematically illustrates a circuit diagram of two memory devices 30a, 30b of a conventional memory module showing the interconnections between the DQ data signal lines 102a, 102b of the memory devices 30a30b and the DQS data strobe signal lines 104a, 104b of the memory devices 30a, 30b. Each of the memory devices 30a, 30b has a plurality of DQ data signal lines and a plurality of DQS data strobe signal lines, however, for simplicity, FIG. 2 only illustrates a single DQ data signal line and a single DQS data strobe signal line for each memory device 30a, 30b. The DQ data signal lines 102a, 102b and the DQS data strobe signal lines 104a, 104b are typically conductive traces etched on the printed circuit board of the memory module. As shown in FIG. 2, each of the memory devices 30a, 30b has their DQ data signal lines 102a, 102b electrically coupled to a common DQ line 112 and their DQS data strobe signal lines 104a, 104b electrically coupled to a common DQS line 114. The common DQ line 112 and the common DQS line 114 are electrically coupled to the memory controller 20 of the computer system. Thus, the computer system is exposed to the loads of both memory devices 30a, 30b concurrently.

In certain embodiments, the circuit 40 selectively isolates the loads of at least some of the memory devices 30 from the computer system. The circuit 40 of certain embodiments is configured to present a significantly reduced load to the computer system. In certain embodiments in which the memory devices 30 are arranged in a plurality of ranks, the circuit 40 selectively isolates the loads of some (e.g., one or more) of the ranks of the memory module 10 from the computer system. In certain other embodiments, the circuit 40 selectively isolates the loads of all of the ranks of the memory module 10 from the computer system. For example, when a memory module 10 is not being accessed by the computer system, the capacitive load on the memory controller 20 of the computer system by the memory module 10 can be substantially reduced to the capacitive load of the circuit 40 of the memory module 10.

Figure 3A:
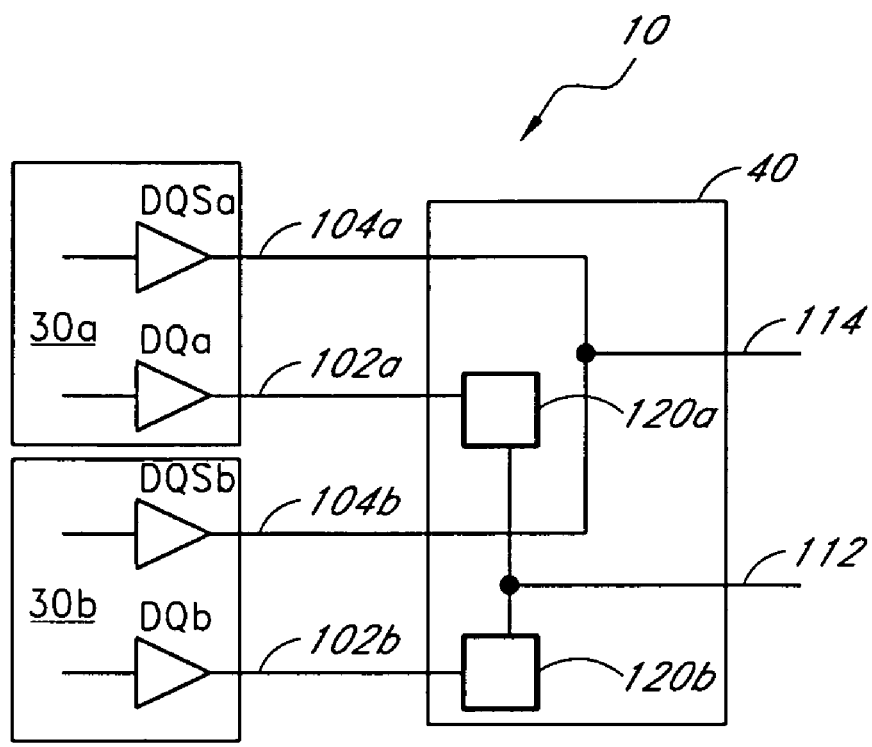
FIGS. 3A and 3B schematically illustrate example memory modules having a circuit which selectively isolates one or both of the DQ data signal lines of the two memory devices from the computer system in accordance with certain embodiments described herein.
Figure 3B:
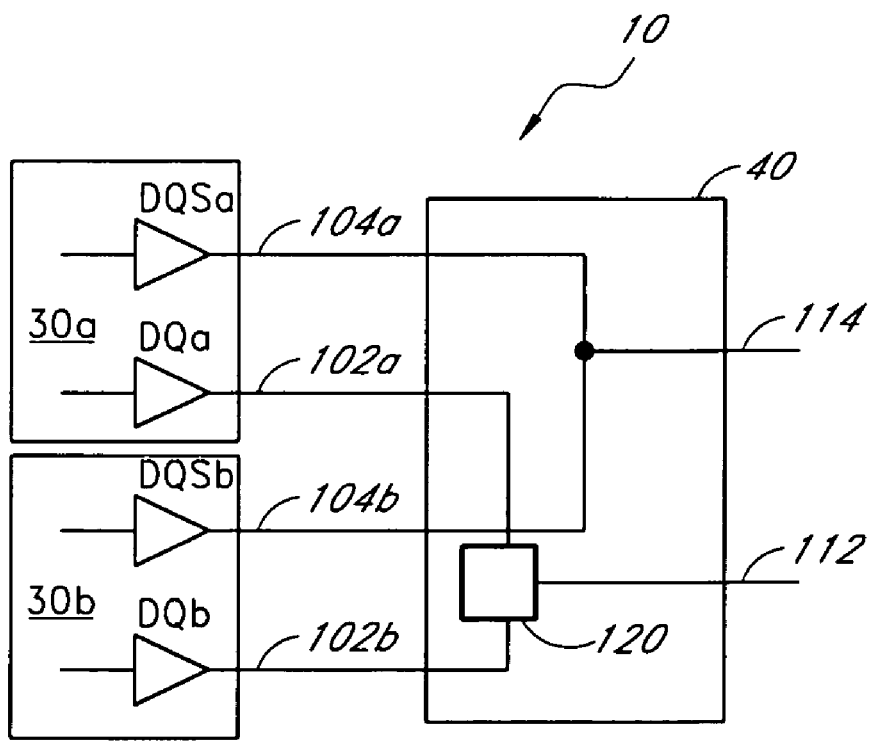

As schematically illustrated by FIGS. 3A and 3B, an example memory module 10 compatible with certain embodiments described herein comprises a circuit 40 which selectively isolates one or both of the DQ data signal lines 102a, 102b of the two memory devices 30a, 30b from the common DQ data signal line 112 coupled to the computer system. Thus, the circuit 40 selectively allows a DQ data signal to be transmitted from the memory controller 20 of the computer system to one or both of the DQ data signal lines 102a, 102b. In addition, the circuit 40 selectively allows one of a first DQ data signal from the DQ data signal line 102a of the first memory device 30a or a second DQ data signal from the DQ data signal line 102b of the second memory device 30b to be transmitted to the memory controller 20 via the common DQ data signal line 112 (see, e.g., triangles on the DQ and DQS lines of FIGS. 3A and 3B which point towards the memory controller). While various figures of the present application denote read operations by use of DQ and DQS lines which have triangles pointing towards the memory controller, certain embodiments described herein are also compatible with write operations (e.g., as would be denoted by triangles on the DQ or DQS lines pointing away from the memory controller).

For example, in certain embodiments, the circuit 40 comprises a pair of switches 120a, 120b on the DQ data signal lines 102a, 102b as schematically illustrated by FIG. 3A. Each switch 120a, 120b is selectively actuated to selectively electrically couple the DQ data signal line 102a to the common DQ signal line 112, the DQ data signal line 102b to the common DQ signal line 112, or both DQ data signal lines 102a, 102b to the common DQ signal line 112. In certain other embodiments, the circuit 40 comprises a switch 120 electrically coupled to both of the DQ data signal lines 102a, 102b, as schematically illustrated by FIG. 3B. The switch 120 is selectively actuated to selectively electrically couple the DQ data signal line 102a to the common DQ signal line 112, the DQ data signal line 102b to the common DQ signal line 112, or both DQ signal lines 102a, 102b to the common DQ signal line 112. Circuits 40 having other configurations of switches are also compatible with embodiments described herein. While each of the memory devices 30a, 30b has a plurality of DQ data signal lines and a plurality of DQS data strobe signal lines, FIGS. 3A and 3B only illustrate a single DQ data signal line and a single DQS data strobe signal line for each memory device 30a, 30b for simplicity. The configurations schematically illustrated by FIGS. 3A and 3B can be applied to all of the DQ data signal lines and DQS data strobe signal lines of the memory module 10.

Figure 4A:
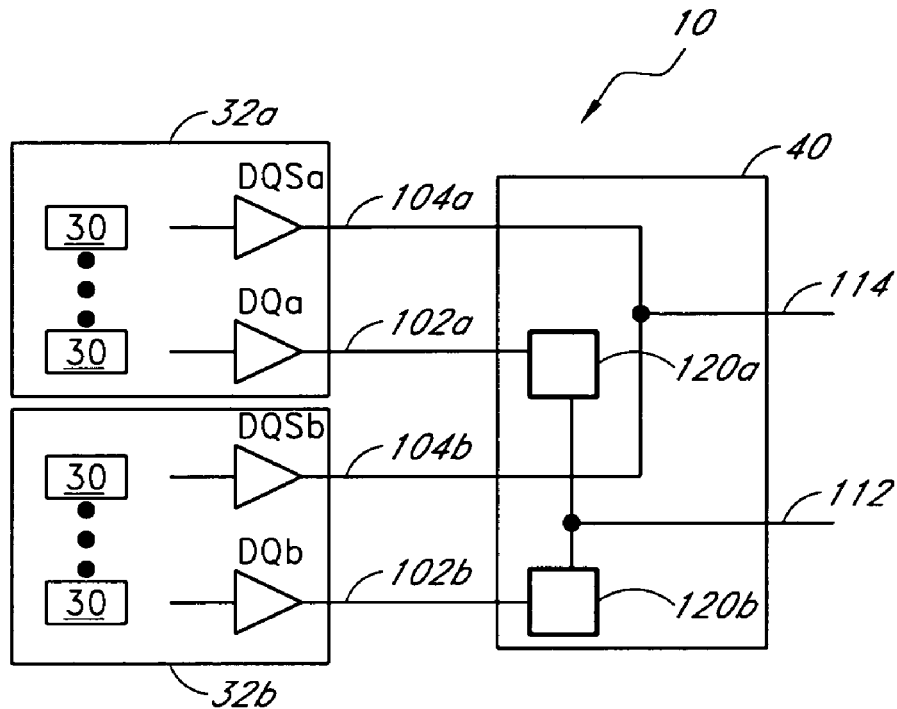
FIGS. 4A and 4B schematically illustrate example memory modules having a circuit which selectively isolates one or both of the DQ data signal lines of the two ranks of memory devices from the, computer system in accordance with certain embodiments described herein.
Figure 4B:
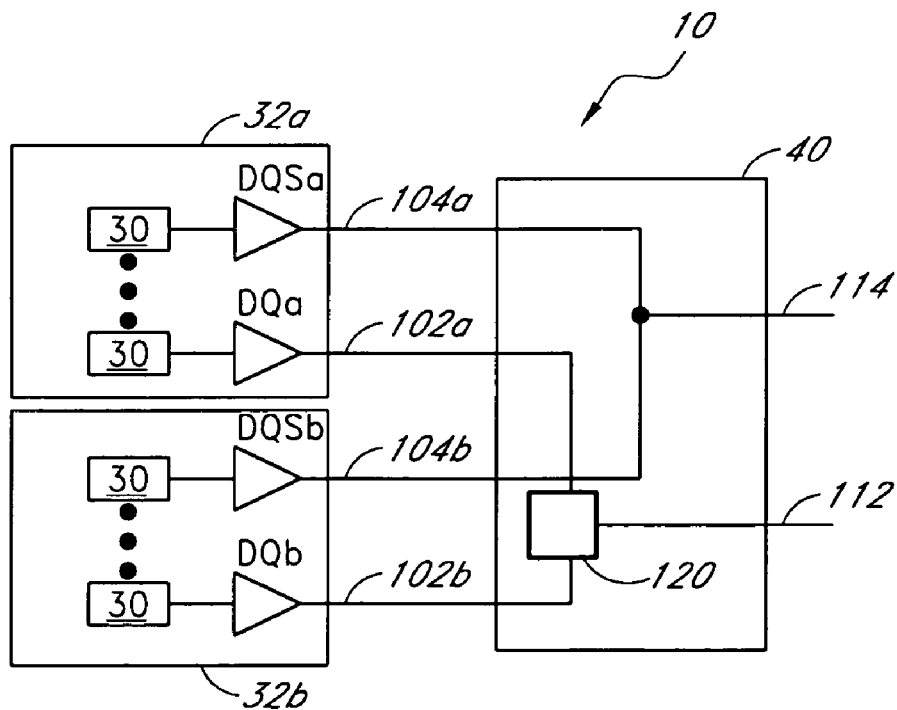
Figure 5A:
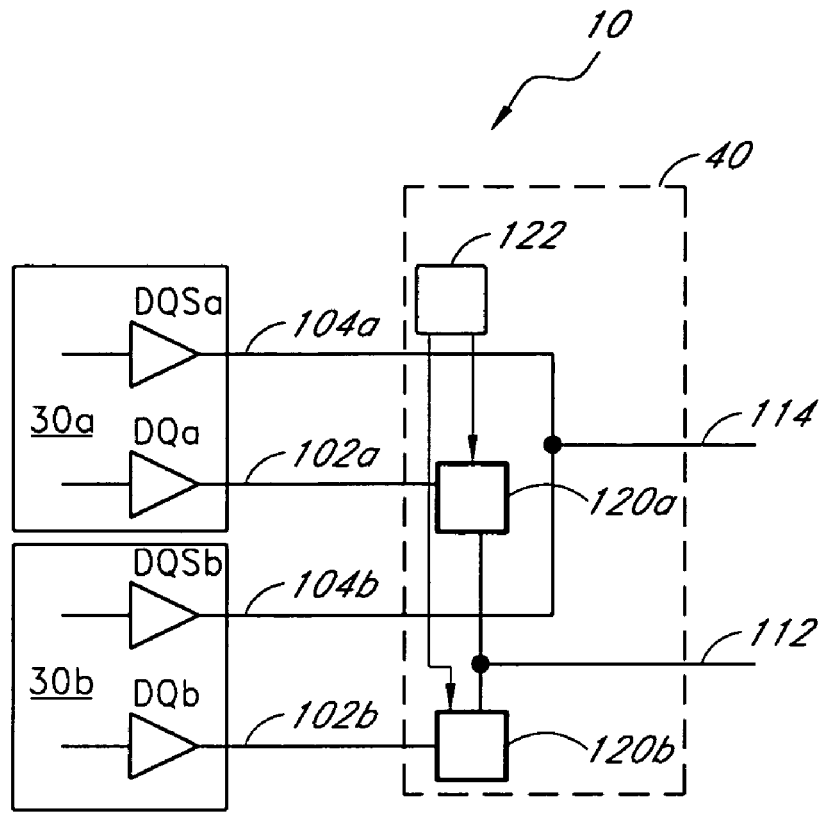
FIGS. 5A-5D schematically illustrate example memory modules having a circuit comprising a logic element and one or more switches operatively coupled to the logic element in accordance with certain embodiments described herein.
Figure 5B:
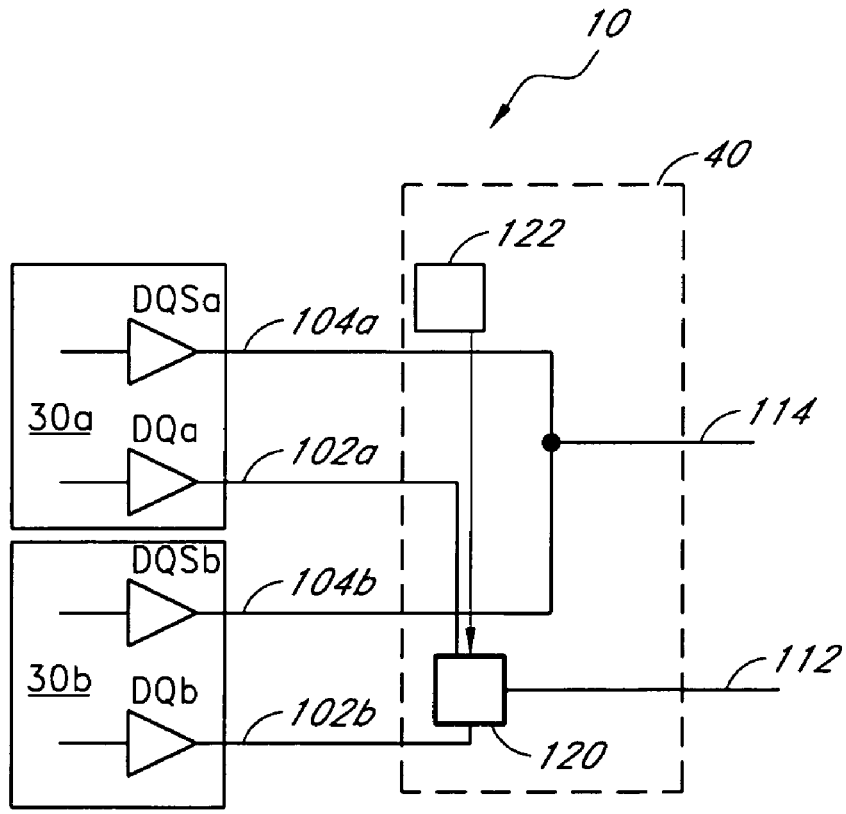
Figure 5C:
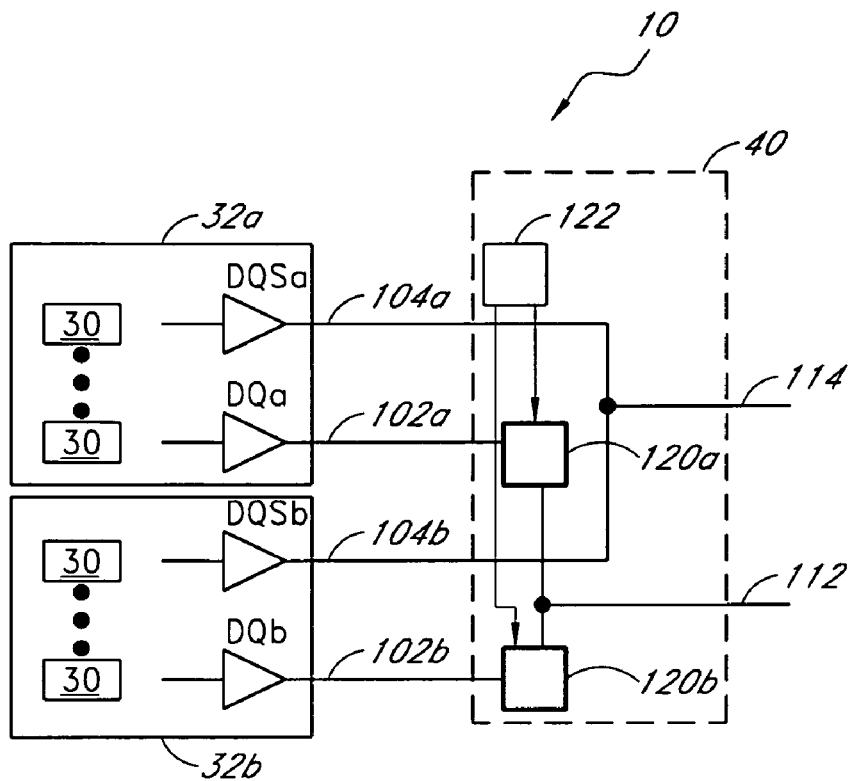
Figure 5D:
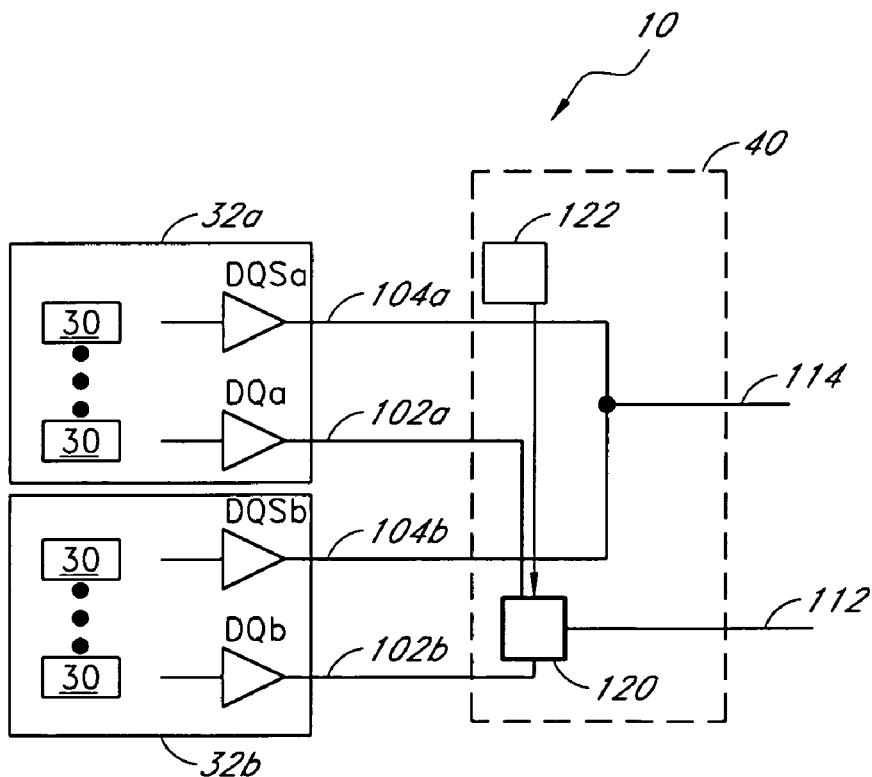

In certain embodiments, the circuit 40 selectively isolates the loads of ranks of memory devices 30 from the computer system. As schematically illustrated in FIGS. 4A and 4B, example memory modules 10 compatible with certain embodiments described herein comprise a first number of memory devices 30 arranged in a first number of ranks 32. The memory modules 10 of FIGS. 4A and 4B comprises two ranks 32a, 32b, with each rank 32a, 32b having a corresponding set of DQ data signal lines and a corresponding set of DQS data strobe lines. Other numbers of ranks (e.g., four ranks) of memory devices 30 of the memory module 10 are also compatible with certain embodiments described herein. For simplicity, FIGS. 4A and 4B illustrate only a single DQ data signal line and a single DQS data strobe signal line from each rank 32.

The circuit 40 of FIG. 4A selectively isolates one or more of the DQ data signal lines 102a, 102b of the two ranks 32a, 32b from the computer system. Thus, the circuit 40 selectively allows a DQ data signal to be transmitted from the memory controller 20 of the computer system to the memory devices 30 of one or both of the ranks 32a, 32b via the DQ data signal lines 102a, 102b. In addition, the circuit 40 selectively allows one of a first DQ data signal from the DQ data signal line 102a of the first rank 32a and a second DQ data signal from the DQ data signal line 102b of the second rank 32b to be transmitted to the memory controller 20 via the common DQ data signal line 112. For example, in certain embodiments, the circuit 40 comprises a pair of switches 120a, 120b on the DQ data signal lines 102a, 102b as schematically illustrated by FIG. 4A. Each switch 120a, 120b is selectively actuated to selectively electrically couple the DQ data signal line 102a to the common DQ data signal line 112, the DQ data signal line 102b to the common DQ data signal line 112, or both DQ data signal lines 102a, 102b to the common DQ data signal line 112. In certain other embodiments, the circuit 40 comprises a switch 120 electrically coupled to both of the DQ data signal lines 102a, 102b, as schematically illustrated by FIG. 4B. The switch 120 is selectively actuated to selectively electrically couple the DQ data signal line 102a to the common DQ data signal line 112, the DQ data signal line 102b to the common DQ data signal line 112, or both DQ data signal lines 102a, 102b to the common DQ data signal line 112. Circuits 40 having other configurations of switches are also compatible with embodiments described herein.

In the example embodiments schematically illustrated by FIGS. 3A, 3B, 4A, and 4B, the circuit 40 comprises a logic element which is integral with and comprises the switches 120 which are coupled to the DQ data signal lines and the DQS data strobe signal lines. In certain such embodiments, each switch 120 comprises a data path multiplexer/demultiplexer. In certain other embodiments, the circuit 40 comprises a logic element 122 which is a separate component operatively coupled to the switches 120, as schematically illustrated by FIGS. 5A-5D. The one or more switches 120 are operatively coupled to the logic element 122 to receive control signals from the logic element 122 and to selectively electrically couple one or more data signal lines to a common data signal line. Example switches compatible with embodiments described herein include, but are not limited to field-effect transistor (FET) switches, such as the SN74AUC1G66 single bilateral analog switch available from Texas Instruments, Inc. of Dallas, Tex. Example logic elements 122 compatible with certain embodiments described herein include, but are not limited to, programmable-logic devices (PLD), application-specific integrated circuits (ASIC), field-programmable gate arrays (FPGA), custom-designed semiconductor devices, and complex programmable-logic devices (CPLD). Example logic elements 122 are available from Lattice Semiconductor Corporation of Hillsboro, Oreg., Altera Corporation of San Jose, Calif., and Xilinx Incorporated of San Jose, Calif.

In certain embodiments, the load isolation provided by the circuit 40 advantageously allows the memory module 10 to present a reduced load (e.g., electrical load, such as capacitive load, inductive load, or impedance load) to the computer system by selectively switching between the two ranks of memory devices 30 to which it is coupled. This feature is used in certain embodiments in which the load of the memory module 10 may otherwise limit the number of ranks or the number of memory devices per memory module. In certain embodiments, the memory module 10 operates as having a data path rank buffer which advantageously isolates the ranks of memory devices 30 of the memory module 10 from one another, from the ranks on other memory modules, and from the computer system. This data path rank buffer of certain embodiments advantageously provides DQ-DQS paths for each rank or sets of ranks of memory devices which are separate from one another, or which are separate from the memory controller of the computer system. In certain embodiments, the load isolation advantageously diminishes the effects of capacitive loading, jitter and other sources of noise. In certain embodiments, the load isolation advantageously simplifies various other aspects of operation of the memory module 10, including but not limited to, setup-and-hold time, clock skew, package skew, and process, temperature, voltage, and transmission line variations.

For certain memory module applications that utilize multiple ranks of memory, increased load on the memory bus can degrade speed performance. In certain embodiments described herein, selectively isolating the loads of the ranks of memory devices 30 advantageously decreases the load on the computer system, thereby allowing the computer system (e.g., server) to run faster with improved signal integrity. In certain embodiments, load isolation advantageously provides system memory with reduced electrical loading, thereby improving the electrical topology to the memory controller 20. In certain such embodiments, the speed and the memory density of the computer system are advantageously increased without sacrificing one for the other.

In certain embodiments, load isolation advantageously increases the size of the memory array supported by the memory controller 20 of the computer system. The larger memory array has an increased number of memory devices 30 and ranks of memory devices 30 of the memory module 10, with a corresponding increased number of chip selects. Certain embodiments described herein advantageously provide more system memory using fewer chip selects, thereby avoiding the chip select limitation of the memory controller.

An exemplary section of Verilog code corresponding to logic compatible with a circuit 40 which provides load isolation is listed below in Example 1. The exemplary code of Example 1 corresponds to a circuit 40 comprising six FET switches for providing load isolation to DQ and DQS lines.

EXAMPLE 1

```
//========================= declarations
        reg             rasN_R, casN_R, weN_R;
        wire            actv_cmd_R, pch_cmd_R, pch_all_cmd_R, ap_xfr_cmd_R_R;
        wire            xfr_cmd_R,mrs_cmd,rd_cmd_R;
//------------------------ DDR 2 FET
        reg             brs0N_R;                        // registered chip sel
        reg             brs1N_R;                        // registered chip sel
        reg             brs2N_R;                        // registered chip sel
        reg             brs3N_R;                        // registered chip sel
        wire            sel;
        wire            sel_01;
        wire            sel_23;
        wire            rd_R1;
        wire            wr_cmd_R,wr_R1;
        reg             rd_R2,rd_R3,rd_R4,rd_R5;
        reg             wr_R2,wr_R3,wr_R4,wr_R5;
        reg             enfet1,enfet2,enfet3,enfet4,enfet5,enfet6;
        wire            wr_01_R1,wr_23_R1;
        reg             wr_01_R2,wr_01_R3,wr_01_R4;
        reg             wr_23_R2,wr_23_R3,wr_23_R4;
        wire            rodt0_a,rodt0_b;
//========================= logic
        always @(posedge clk_in)
                begin
                        brs0N_R <= brs0_in_N;   // cs0
                        brs1N_R <= brs1_in_N;   // cs1
                        brs2N_R <= brs2_in_N;   // cs2
                        brs3N_R <= brs3_in_N;   // cs3
                        rasN_R <= brras_in_N ;
                        casN_R <= brcas_in_N ;
                        weN_R <= bwe_in_N ;
                end
assign sel = ~brs0N_R | ~brs1N_R | ~brs2N_R | ~brs3N_R ;
assign sel_01 = ~brs0N_R | ~brs1N_R ;
assign sel_23 = ~brs2N_R | ~brs3N_R ;
assign actv_cmd_R = !rasN_R & casN_R & weN_R;           // activate cmd
assign pch_cmd_R = !rasN_R & casN_R & !weN_R ;          // pchg cmd
assign xfr_cmd_R = rasN_R & !casN_R;                    // xfr cmd
assign mrs_cmd = !rasN_R & !casN_R & !weN_R ;           // md reg set cmd
assign rd_cmd_R = rasN_R & !casN_R & weN_R ;            // read cmd
assign wr_cmd_R = rasN_R & !casN_R & !weN_R ;           // write cmd
//------------------------------------
assign   rd_R1 = sel & rd_cmd_R;   // rd cmd cyc 1
assign   wr_R1 = sel & wr_cmd_R;   // wr cmd cyc 1
//------------------------------------
        always @(posedge clk_in)
                begin
                        rd_R2 <= rd_R1 ;
                        rd_R3 <= rd_R2;
                        rd_R4 <= rd_R3;
                        rd_R5 <= rd_R4;
//                      rd0_o_R6 <= rd0_o_R5;
                        wr_R2 <= wr_R1 ;
                        wr_R3 <= wr_R2;
                        wr_R4 <= wr_R3;
```

-continued

```
                    wr_R5 <= wr_R4;
                end
//----------------------------------------
assign    wr_01_R1 = sel_01 & wr_cmd_R; // wr cmd cyc 1 for cs 2 & cs3
assign    wr_23_R1 = sel_23 & wr_cmd_R; // wr cmd cyc 1 for cs 2 & cs3
    always @(posedge clk_in)
                begin
                    wr_01_R2 <= wr_01_R1 ;
                    wr_01_R3 <= wr_01_R2;
                    wr_01_R4 <= wr_01_R3;
                    wr_23_R2 <= wr_23_R1 ;
                    wr_23_R3 <= wr_23_R2;
                    wr_23_R4 <= wr_23_R3;
                end
assign    rodt0_ab = (rodt0)           // odt cmd from sys
                    | (wr_23_R1)       // wr 1st cyc to other rnks (assume single dimm per channel)
                    | (wr_23_R2)       // wr 2nd cyc to other rnks (assume single dimm per channel)
                    | (wr_23_R3)       // wr 3rd cyc to other rnks (assume single dimm per channel)
                    ;
assign    rodt1_ab = (rodt1)           // odt cmd from sys
                    | (wr_01_R1)       // wr 1st cyc to other rnks (assume single dimm per channel)
                    | (wr_01_R2)       // wr 2nd cyc to other rnks (assume single dimm per channel)
                    | (wr_01_R3)       // wr 3rd cyc to other rnks (assume single dimm per channel)
                    ;
//----------------------------------------
    always @(posedge clk_in)
                begin
        if (
            | (rd_R2)                      // pre-am rd
            | (rd_R3)                      // 1st cyc of rd brst (cl3)
            | (rd_R4)                      // 2nd cyc of rd brst (cl3)
            | (wr_R1)                      // pre-am wr
            | (wr_R2)                      // wr brst 1st cyc
            | (wr_R3)                      // wr brst 2nd cyc
            ) begin
                    enfet1 <= 1'b1;        // enable fet
                    enfet2 <= 1'b1;        // enable fet
                    enfet3 <= 1'b1;        // enable fet
                    enfet4 <= 1'b1;        // enable fet
                    enfet5 <= 1'b1;        // enable fet
                    enfet6 <= 1'b1;        // enable fet
                end
        else
                begin
                    enfet1 <= 1'b0;        // disable fet
                    enfet2 <= 1'b0;        // disable fet
                    enfet3 <= 1'b0;        // disable fet
                    enfet4 <= 1'b0;        // disable fet
                    enfet5 <= 1'b0;        // disable fet
                    enfet6 <= 1'b0;        // disable fet
                end
    end
end
```

Back-to-Back Adjacent Read Commands

Figure 6A:
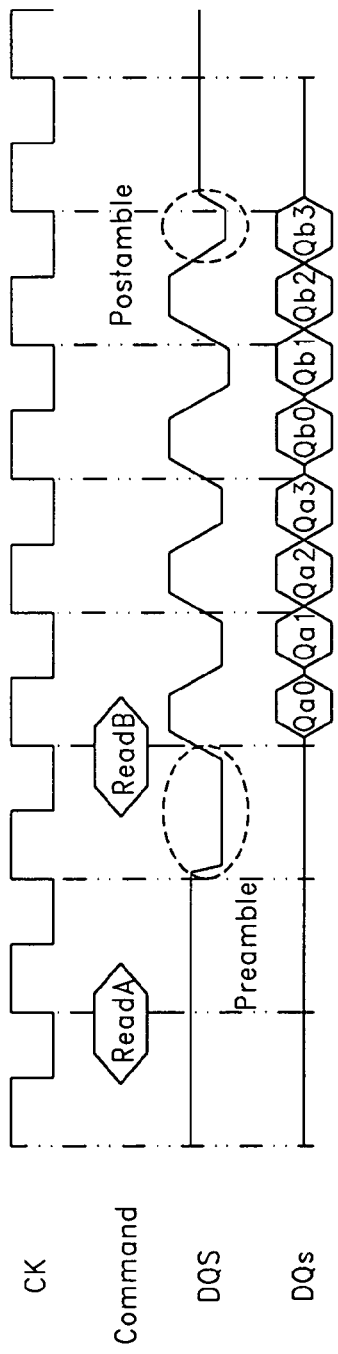
FIG. 6A shows an exemplary timing diagram of a gapless read burst for a back-to-back adjacent read condition from one memory device.

Due to their source synchronous nature, DDR SDRAM (e.g., DDR1, DDR2, DDR3) memory devices operate with a data transfer protocol which surrounds each burst of data strobes with a pre-amble time interval and a post-amble time interval. The pre-amble time interval provides a timing window for the receiving memory device to enable its data capture circuitry when a known valid level is present on the strobe signal to avoid false triggers of the memory device's capture circuit. The post-amble time interval provides extra time after the last strobe for this data capture to facilitate good signal integrity. In certain embodiments, when the computer system accesses two consecutive bursts of data from the same memory device, termed herein as a "back-to-back adjacent read," the post-amble time interval of the first read command and the pre-amble time interval of the second read command are skipped by design protocol to increase read efficiency. FIG. 6A shows an exemplary timing diagram of this "gapless" read burst for a back-to-back adjacent read condition from one memory device.

Figure 6B:
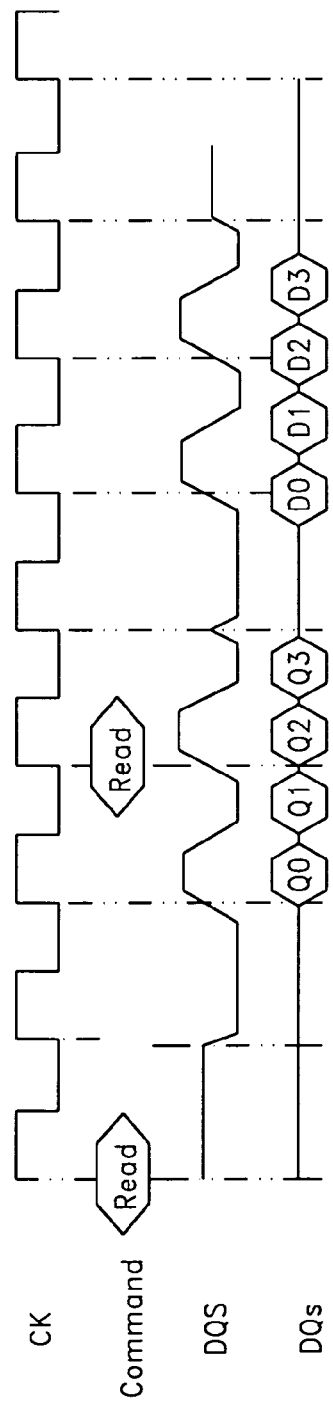
FIG. 6B shows an exemplary timing diagram with an extra clock cycle between successive read commands issued to different memory devices for successive read accesses from different memory devices.

In certain embodiments, when the second read command accesses data from a different memory device than does the first read command, there is at least one time interval (e.g., clock cycle) inserted between the data strobes of the two memory devices. This inserted time interval allows both read data bursts to occur without the post-amble time interval of the first read data burst colliding or otherwise interfering with the pre-amble time interval of the second read data burst. In certain embodiments, the memory controller of the computer system inserts an extra clock cycle between successive read commands issued to different memory devices, as shown in the exemplary timing diagram of FIG. 6B for successive read accesses from different memory devices.

In typical computer systems, the memory controller is informed of the memory boundaries between the ranks of memory of the memory module prior to issuing read commands to the memory module. Such memory controllers can insert wait time intervals or clock cycles to avoid collisions or interference between back-to-back adjacent read commands which cross memory device boundaries, which are referred to herein as "BBARX."

Figure 7:
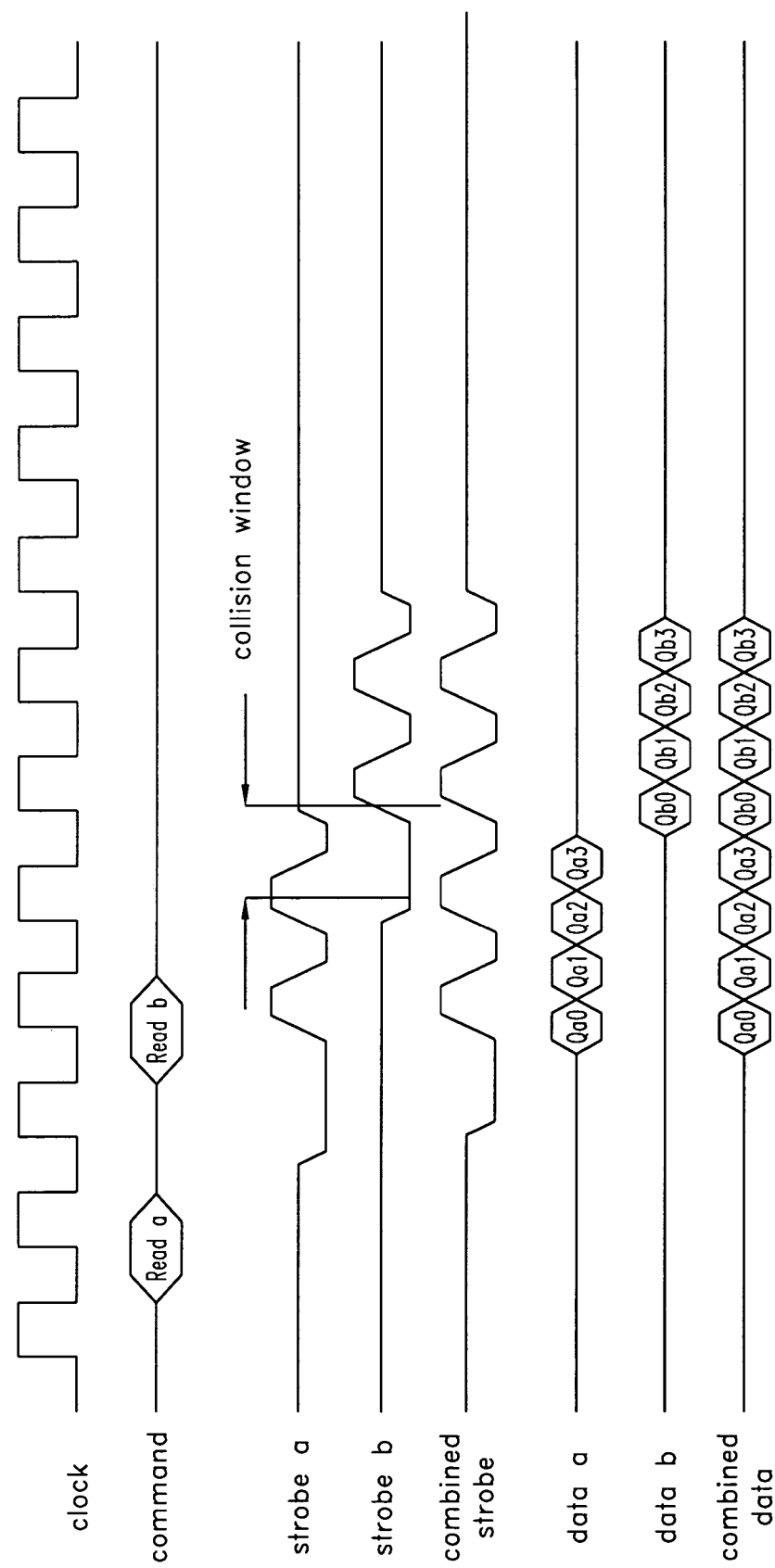
FIG. 7 shows an exemplary timing diagram in which the last data strobe of memory device "a" collides with the preamble time interval of the data strobe of memory device "b."

In certain embodiments described herein in which the number of ranks 32 of the memory module 10 is doubled or quadrupled, the circuit 40 generates a set of output address and command signals so that the selection decoding is transparent to the computer system. However, in certain such embodiments, there are memory device boundaries of which the computer system is unaware, so there are occasions in which BBARX occurs without the cognizance of the memory controller 20 of the computer system. As shown in FIG. 7, the last data strobe of memory device "a" collides with the preamble time interval of the data strobe of memory device "b," resulting in a "collision window."

FIGS. 8A-8D schematically illustrate circuit diagrams of example memory modules 10 comprising a circuit 40 which multiplexes the DQS data strobe signal lines 104a, 104b of two ranks 32a, 32b from one another in accordance with certain embodiments described herein. While the DQS data strobe signal lines 104a, 104b of FIGS. 8A-8D correspond to two ranks 32a, 32b of memory devices 30, in certain other embodiments, the circuit 40 multiplexes the DQS data strobe signal lines 104a, 104b corresponding to two individual memory devices 30a, 30b.

Figure 8A:
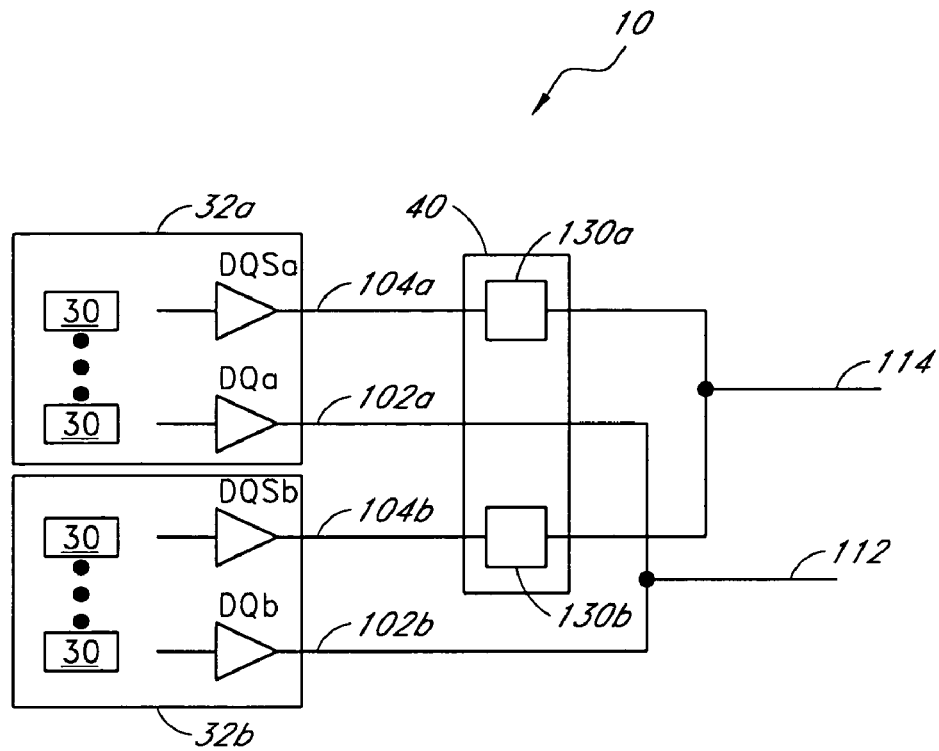
FIGS. 8A-8D schematically illustrate circuit diagrams of example memory modules comprising a circuit which multiplexes the DQS data strobe signal lines from one another in accordance with certain embodiments described herein.

FIG. 8A schematically illustrates a circuit diagram of an exemplary memory module 10 comprising a circuit 40 in accordance with certain embodiments described herein. In certain embodiments, BBARX collisions are avoided by a mechanism which electrically isolates the DQS data strobe signal lines 104a, 104b from one another during the transition from the first read data burst of one rank 32a of memory devices 30 to the second read data burst of another rank 32b of memory devices 30.

In certain embodiments, as schematically illustrated by FIG. 8A, the circuit 40 comprises a first switch 130 a electrically coupled to a first DQS data strobe signal line 104a of a first rank 32a of memory devices 30 and a second switch 130b electrically coupled to a second DQS data strobe signal line 104b of a second rank 32b of memory devices 30. In certain embodiments, the time for switching the first switch 130a and the second switch 130b is between the two read data bursts (e.g., after the last DQS data strobe of the read data burst of the first rank 32a and before the first DQS data strobe of the read data burst of the second rank 32b). During the read data burst for the first rank 32a, the first switch 130a is enabled. After the last DQS data strobe of the first rank 32a and before the first DQS data strobe of the second rank 32b, the first switch 130a is disabled and the second switch 130b is enabled.

As shown in FIG. 8A, each of the ranks 32a, 32b otherwise involved in a BBARX collision have their DQS data strobe signal lines 104a, 104b selectively electrically coupled to the common DQS line 114 through the circuit 40. The circuit 40 of certain embodiments multiplexes the DQS data strobe signal lines 104a, 104b of the two ranks 32a, 32b of memory devices 30 from one another to avoid a BBARX collision.

Figure 8B:
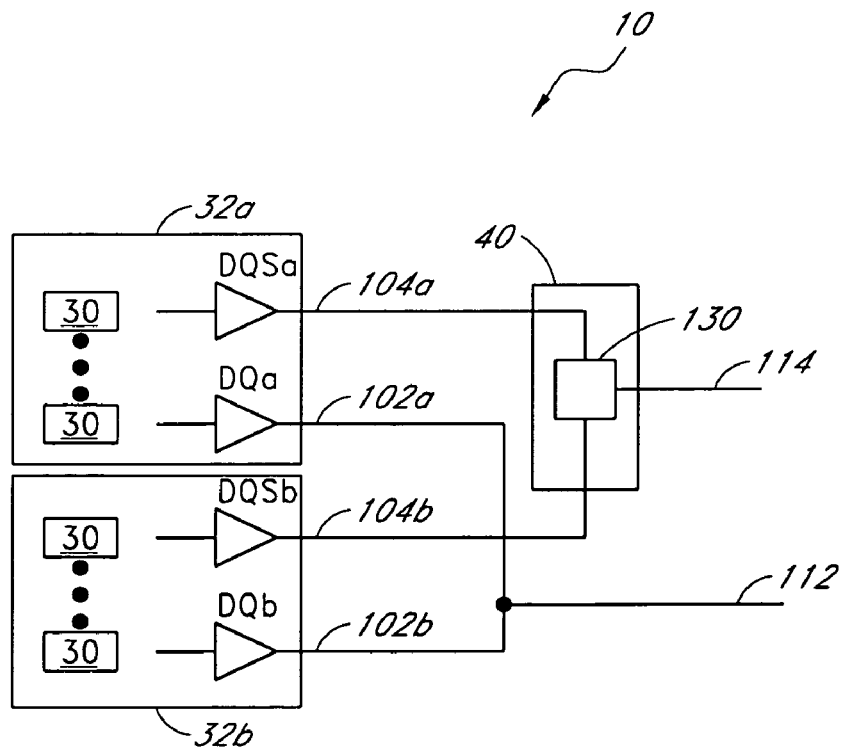

In certain embodiments, as schematically illustrated by FIG. 8B, the circuit 40 comprises a switch 130 which multiplexes the DQS data strobe signal lines 104a, 104b from one another. For example, the circuit 40 receives a DQS data strobe signal from the common DQS data strobe signal line 114 and selectively transmits the DQS data strobe signal to the first DQS data strobe signal line 104a, to the second DQS data strobe signal line 104b, or to both DQS data strobe signal lines 104a, 104b. As another example, the circuit 40 receives a first DQS data strobe signal from the first rank 32a of memory devices 30 and a second DQS data strobe signal from a second rank 32b of memory devices 30 and selectively switches one of the first and second DQS data strobe signals to the common DQS data strobe signal line 114.

Figure 8C:
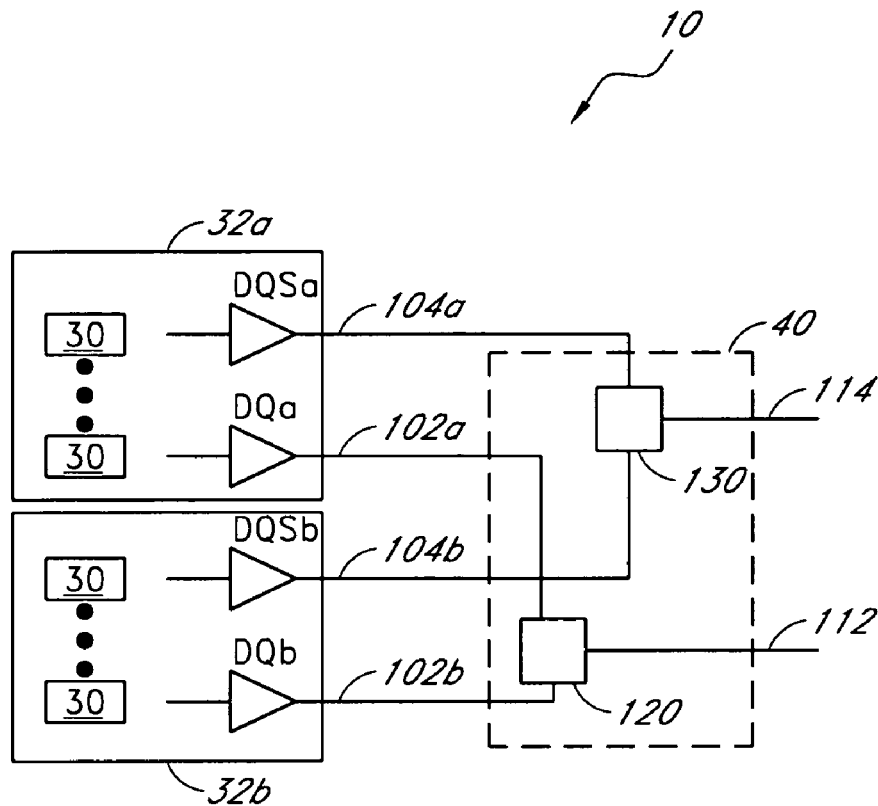
Figure 8D:
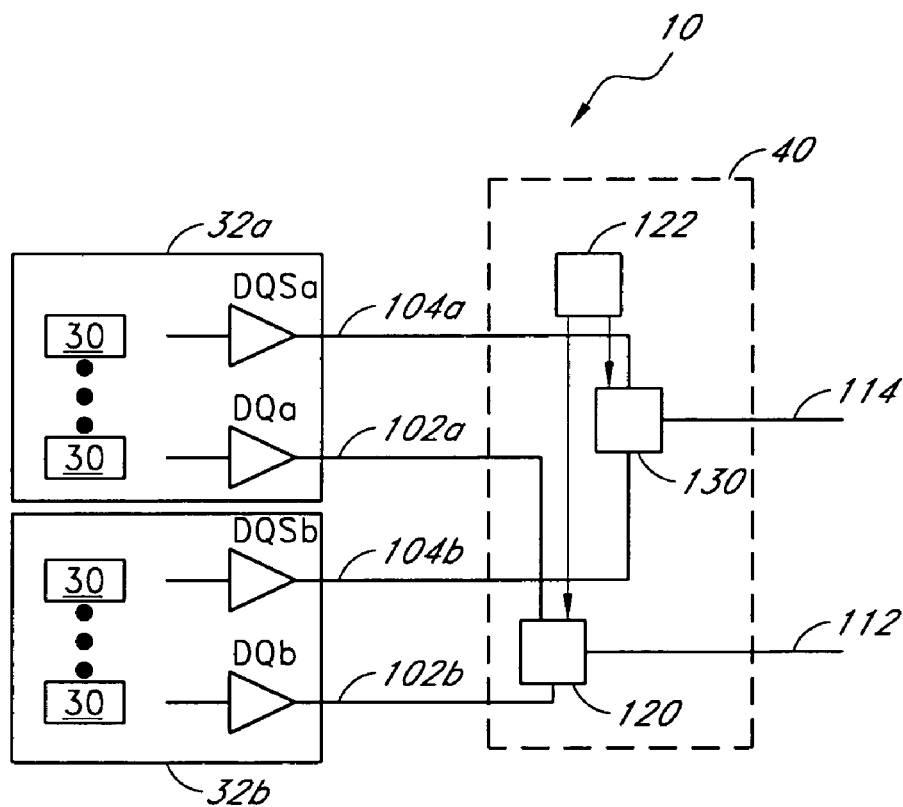

In certain embodiments, the circuit 40 also provides the load isolation described above in reference to FIGS. 1-5. For example, as schematically illustrated by FIG. 8C, the circuit 40 comprises both the switch 120 for the DQ data signal lines 102a, 102b and the switch 130 for the DQS data strobe signal lines 104a, 104b. While in certain embodiments, the switches 130 are integral with a logic element of the circuit 40, in certain other embodiments, the switches 130 are separate components which are operatively coupled to a logic element 122 of the circuit 40, as schematically illustrated by FIG. 8D. In certain such embodiments, the control and timing of the switch 130 is performed by the circuit 40 which is resident on the memory module 10. Example switches 130 compatible with embodiments described herein include, but are not limited to field-effect transistor (FET) switches, such as the SN74AUC1G66 single bilateral analog switch available from Texas Instruments, Inc. of Dallas, Tex., and multiplexers, such as the SN74AUC2G53 2:1 analog multiplexer/demultiplexer available from Texas Instruments, Inc. of Dallas, Tex.

The circuit 40 of certain embodiments controls the isolation of the DQS data strobe signal lines 104a, 104b by monitoring commands received by the memory module 10 from the computer system and producing "windows" of operation whereby the appropriate switches 130 are activated or deactivated to enable and disable the DQS data strobe signal lines 104a, 104b to mitigate BBARX collisions. In certain other embodiments, the circuit 40 monitors the commands received by the memory module 10 from the computer system and selectively activates or deactivates the switches 120 to enable and disable the DQ data signal lines 102a, 102b to reduce the load of the memory module 10 on the computer system. In still other embodiments, the circuit 40 performs both of these functions together.

Command Signal Translation

Most high-density memory modules are currently built with 512-Megabit ("512-Mb") memory devices wherein each memory device has a 64M×8-bit configuration. For example, a 1-Gigabyte ("1-GB") memory module with error checking capabilities can be fabricated using eighteen such 512-Mb memory devices. Alternatively, it can be economically advantageous to fabricate a 1-GB memory module using lower-density memory devices and doubling the number of memory devices used to produce the desired word width. For example, by fabricating a 1-GB memory module using thirty-six 256-Mb memory devices with 64M×4-bit configuration, the cost of the resulting 1-GB memory module can be reduced since the unit cost of each 256-Mb memory device is typically lower than one-half the unit cost of each 512-Mb memory device. The cost savings can be significant, even though twice as many 256-Mb memory devices are used in place of the 512-Mb memory devices. For example, by using pairs of 512-Mb memory devices rather than single 1-Gb memory devices, certain embodiments described herein reduce the cost of the memory module by a factor of up to approximately five.

Market pricing factors for DRAM devices are such that higher-density DRAM devices (e.g., 1-Gb DRAM devices) are much more than twice the price of lower-density DRAM devices (e.g., 512-Mb DRAM devices). In other words, the price per bit ratio of the higher-density DRAM devices is greater than that of the lower-density DRAM devices. This pricing difference often lasts for months or even years after the introduction of the higher-density DRAM devices, until volume production factors reduce the costs of the newer higher-density DRAM devices. Thus, when the cost of a higher-density DRAM device is more than the cost of two lower-density DRAM devices, there is an economic incentive for utilizing pairs of the lower-density DRAM devices to replace individual higher-density DRAM devices.

Figure 9A:
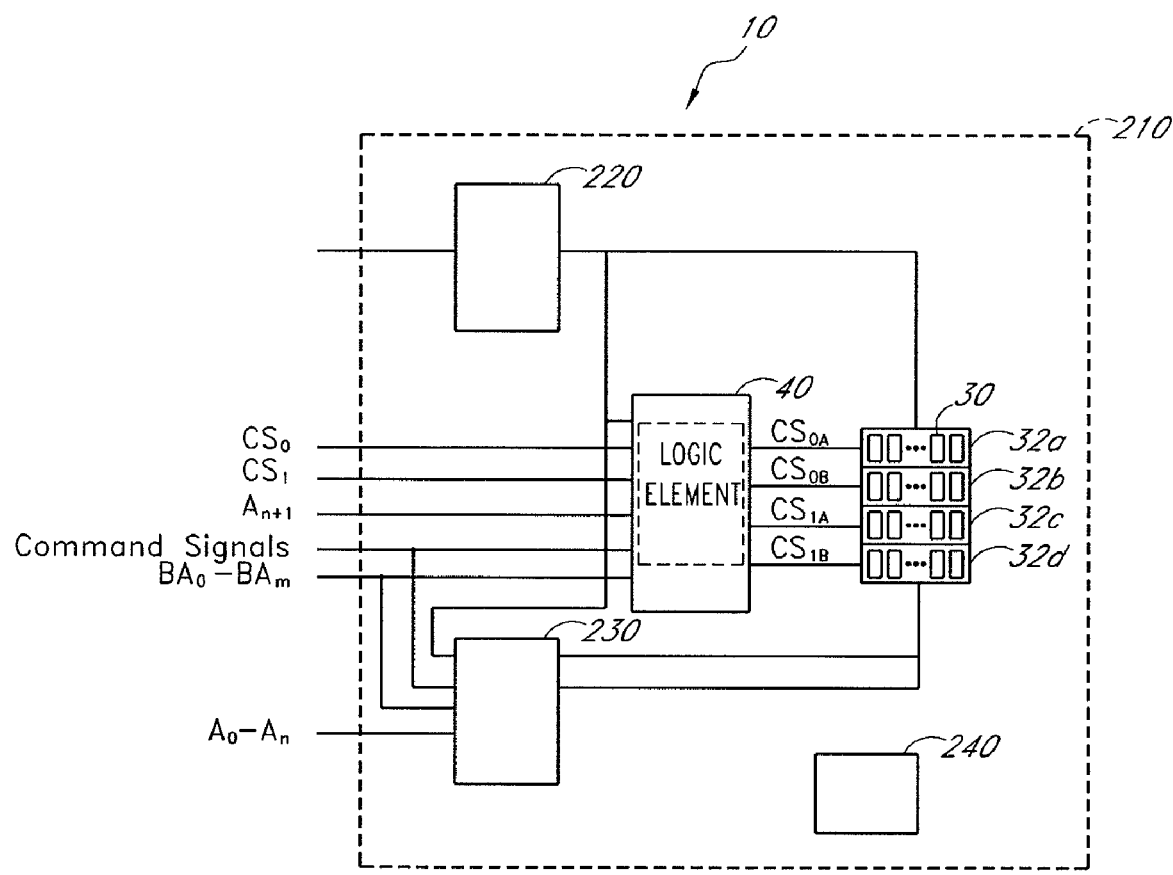
FIG. 9A schematically illustrates an example memory module with four ranks of memory devices compatible with certain embodiments described herein.

FIG. 9A schematically illustrates an exemplary memory module 10 compatible with certain embodiments described herein. The memory module 10 is connectable to a memory controller 20 of a computer system (not shown). The memory module 10 comprises a printed circuit board 210 and a plurality of memory devices 30 coupled to the printed circuit board 210. The plurality-of memory devices 30 has a first number of memory devices 30. The memory module 10 further comprises a circuit 40 coupled to the printed circuit board 210. The circuit 40 receives a set of input address and command signals from the computer system. The set of input address and command signals correspond to a second number of memory devices 30 smaller than the first number of memory devices 30. The circuit 40 generates a set of output address and command signals in response to the set of input address and command signals. The set of output address and command signals corresponds to the first number of memory devices 30.

In certain embodiments, as schematically illustrated in FIG. 9A, the memory module 10 further comprises a phase-lock loop device 220 coupled to the printed circuit board 210 and a register 230 coupled to the printed circuit board 210. In certain embodiments, the phase-lock loop device 220 and the register 230 are each mounted on the printed circuit board 210. In response to signals received from the computer system, the phase-lock loop device 220 transmits clock signals to the plurality of memory devices 30, the circuit 40, and the register 230. The register 230 receives and buffers a plurality of command signals and address signals (e.g., bank address signals, row address signals, column address signals, gated column address strobe signals, chip-select signals), and transmits corresponding signals to the appropriate memory devices 30. In certain embodiments, the register 230 comprises a plurality of register devices. While the phase-lock loop device 220, the register 230, and the circuit 40 are described herein in certain embodiments as being separate components, in certain other embodiments, two or more of the phase-lock loop device 220, the register 230, and the circuit 40 are portions of a single component. Persons skilled in the art are able to select a phase-lock loop device 220 and a register 230 compatible with embodiments described herein.

In certain embodiments, the memory module 10 further comprises electrical components which are electrically coupled to one another and are surface-mounted or embedded on the printed circuit board 210. These electrical components can include, but are not limited to, electrical conduits, resistors, capacitors, inductors, and transistors. In certain embodiments, at least some of these electrical components are discrete, while in other certain embodiments, at least some of these electrical components are constituents of one or more integrated circuits.

In certain embodiments, the printed circuit board 210 is mountable in a module slot of the computer system. The printed circuit board 210 of certain such embodiments has a plurality of edge connections electrically coupled to corresponding contacts of the module slot and to the various components of the memory module 10, thereby providing electrical connections between the computer system and the components of the memory module 10.

Figure 9B:
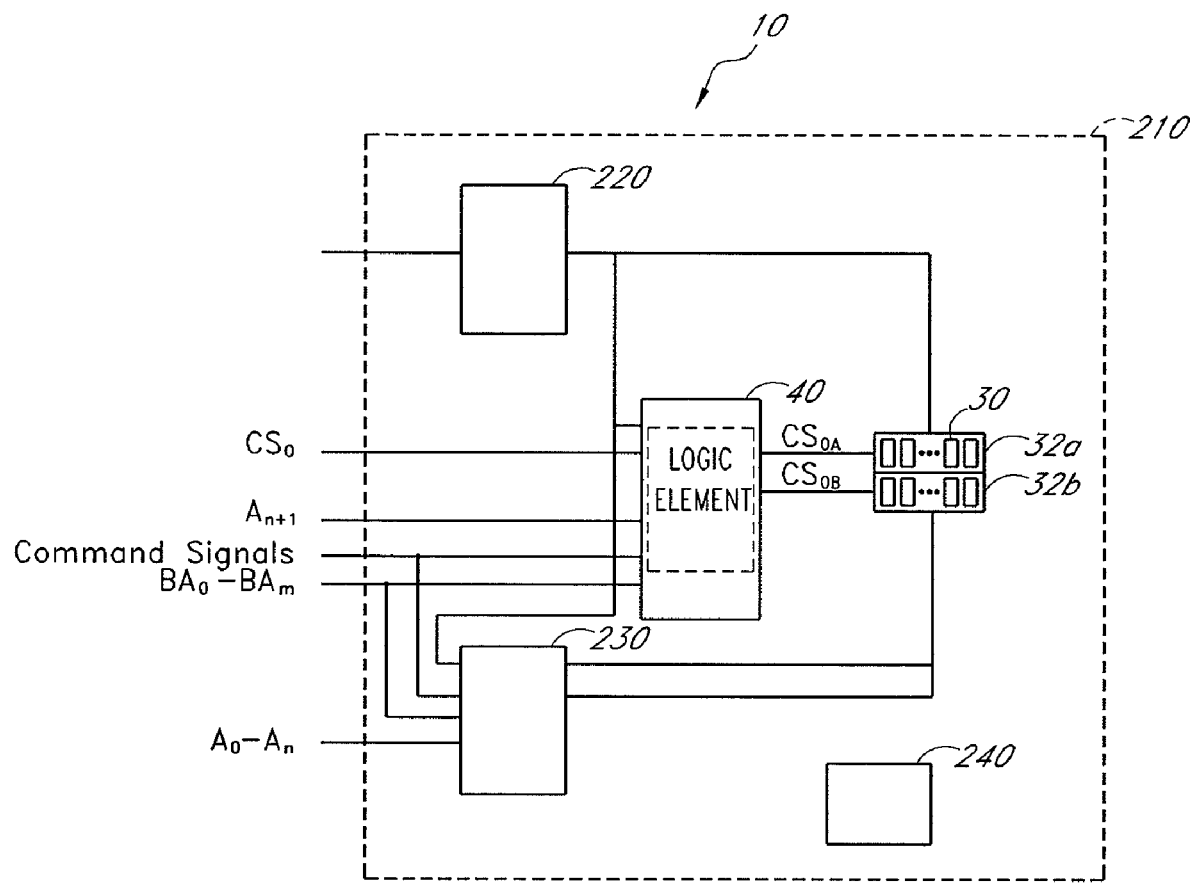
FIG. 9B schematically illustrates an example memory module with two ranks of memory devices compatible with certain embodiments described herein.

In certain embodiments, the plurality of memory devices 30 are arranged in a first number of ranks 32. For example, in certain embodiments, the memory devices 30 are arranged in four ranks 32a, 32b, 32c, 32d, as schematically illustrated by FIG. 9A. In certain other embodiments, the memory devices 30 are arranged in two ranks 32a, 32b, as schematically illustrated by FIG. 9B. Other numbers of ranks 32 of the memory devices 30 are also compatible with embodiments described herein.

As schematically illustrated by FIGS. 9A and 9B, in certain embodiments, the circuit 40 receives a set of input command signals (e.g., refresh, precharge) and address signals (e.g., bank address signals, row address signals, column address signals, gated column address strobe signals, chip-select signals) from the memory controller 20 of the computer system. In response to the set of input address and command signals, the circuit 40 generates a set of output address and command signals.

In certain embodiments, the set of output address and command signals corresponds to a first number of ranks in which the plurality of memory devices 30 of the memory module 10 are arranged, and the set of input address and command signals corresponds to a second number of ranks per memory module for which the computer system is configured. The second number of ranks in certain embodiments is smaller than the first number of ranks. For example, in the exemplary embodiment as schematically illustrated by FIG. 9A, the first number of ranks is four while the second number of ranks is two. In the exemplary embodiment of FIG. 9B, the first number of ranks is two while the second number of ranks is one. Thus, in certain embodiments, even though the memory module 10 actually has the first number of ranks of memory devices 30, the memory module 10 simulates a virtual memory module by operating as having the second number of ranks of memory devices 30. In certain embodiments, the memory module 10 simulates a virtual memory module when the number of memory devices 30 of the memory module 10 is larger than the number of memory devices 30 per memory module for which the computer system is configured to utilize. In certain embodiments, the circuit 40 comprises logic (e.g., address decoding logic, command decoding logic) which translates between a system memory domain of the computer system and a physical memory domain of the memory module 10.

In certain embodiments, the computer system is configured for a number of ranks per memory module which is smaller than the number of ranks in which the memory devices 30 of the memory module 10 are arranged. In certain such embodiments, the computer system is configured for two ranks of memory per memory module (providing two chip-select signals $CS_0$, $CS_1$) and the plurality of memory modules 30 of the memory module 10 are arranged in four ranks, as schematically illustrated by FIG. 9A. In certain other such embodiments, the computer system is configured for one rank of memory per memory module (providing one chip-select signal $CS_0$) and the plurality of memory modules 30 of the memory module 10 are arranged in two ranks, as schematically illustrated by FIG. 9B.

In the exemplary embodiment schematically illustrated by FIG. 9A, the memory module 10 has four ranks of memory devices 30 and the computer system is configured for two ranks of memory devices per memory module. The memory module 10 receives row/column address signals or signal bits ($A_0$-$A_{n+1}$), bank address signals ($BA_0$-$BA_m$), chip-select signals ($CS_0$ and $CS_1$), and command signals (e.g., refresh, precharge, etc.) from the computer system. The $A_0$-$A_n$ row/column address signals are received by the register 230, which buffers these address signals and sends these address signals to the appropriate ranks of memory devices 30. The circuit 40 receives the two chip-select signals ($CS_0$-$CS_1$) and one row/column address signal ($A_{n+1}$) from the computer system. Both the circuit 40 and the register 230 receive the bank address signals ($BA_0$-$BA_m$) and at least one command signal (e.g., refresh, precharge, etc.) from the computer system.

Logic Tables

Table 1 provides a logic table compatible with certain embodiments described herein for the selection among ranks of memory devices 30 using chip-select signals.

TABLE 1

| State | $CS_0$ | $CS_1$ | $A_{n+1}$ | Command | $CS_{0A}$ | $CS_{0B}$ | $CS_{1A}$ | $CS_{1B}$ |
|---|---|---|---|---|---|---|---|---|
| 1 | 0 | 1 | 0 | Active | 0 | 1 | 1 | 1 |
| 2 | 0 | 1 | 1 | Active | 1 | 0 | 1 | 1 |
| 3 | 0 | 1 | x | Active | 0 | 0 | 1 | 1 |
| 4 | 1 | 0 | 0 | Active | 1 | 1 | 0 | 1 |
| 5 | 1 | 0 | 1 | Active | 1 | 1 | 1 | 0 |
| 6 | 1 | 0 | x | Active | 1 | 1 | 0 | 0 |
| 7 | 1 | 1 | x | x | 1 | 1 | 1 | 1 |

Note:
1. $CS_0$, $CS_1$, $CS_{0A}$, $CS_{0B}$, $CS_{1A}$, and $CS_{1B}$ are active low signals.
2. $A_{n+1}$ is an active high signal.
3. 'x' is a Don't Care condition.
4. Command involves a number of command signals that define operations such as refresh, precharge, and other operations.

In Logic State 1: $CS_0$ is active low, $A_{n+1}$ is non-active, and Command is active. $Cs_{0A}$ is pulled low, thereby selecting Rank 0.

In Logic State 2: $CS_0$ is active low, $A_{n+1}$ is active, and Command is active. $CS_{0B}$ is pulled low, thereby selecting Rank 1.

In Logic State 3: $CS_0$ is active low, $A_{n+1}$ is Don't Care, and Command is active high. $CS_{0A}$ and $CS_{0B}$ are pulled low, thereby selecting Ranks 0 and 1.

In Logic State 4: $CS_1$ is active low, $A_{n+1}$ is non-active, and Command is active. $CS_{1A}$ is pulled low, thereby selecting Rank 2.

In Logic State 5: $CS_1$ is active low, $A_{n+1}$ is active, and Command is active. $CS_{1B}$ is pulled low, thereby selecting Rank 3.

In Logic State 6: $CS_1$ is active low, $A_{n+1}$ is Don't Care, and Command is active. $CS_{1A}$ and $CS_{1B}$ are pulled low, thereby selecting Ranks 2 and 3.

In Logic State 7: $CS_0$ and $CS_1$ are pulled non-active high, which deselects all ranks, i.e., $CS_{0A}$, $CS_{0B}$, $CS_{1A}$, and $CS_{1B}$ are pulled high.

The "Command" column of Table 1 represents the various commands that a memory device (e.g., a DRAM device) can execute, examples of which include, but are not limited to, activation, read, write, precharge, and refresh. In certain embodiments, the command signal is passed through to the selected rank only (e.g., state 4 of Table 1). In such embodiments, the command signal (e.g., read) is sent to only one memory device or the other memory device so that data is supplied from one memory device at a time. In other embodiments, the command signal is passed through to both associated ranks (e.g., state 6 of Table 1). In such embodiments, the command signal (e.g., refresh) is sent to both memory devices to ensure that the memory content of the memory devices remains valid over time. Certain embodiments utilize a logic table such as that of Table 1 to simulate a single memory device from two memory devices by selecting two ranks concurrently.

Table 2 provides a logic table compatible with certain embodiments described herein for the selection among ranks of memory devices 30 using gated CAS signals.

TABLE 2

| CS* | RAS* | CAS* | WE* | Density Bit | $A_{10}$ | Command | CAS0* | CAS1* |
|---|---|---|---|---|---|---|---|---|
| 1 | x | x | x | x | x | NOP | x | x |
| 0 | 1 | 1 | 1 | x | x | NOP | 1 | 1 |
| 0 | 0 | 1 | 1 | 0 | x | ACTIVATE | 1 | 1 |
| 0 | 0 | 1 | 1 | 1 | x | ACTIVATE | 1 | 1 |
| 0 | 1 | 0 | 1 | 0 | x | READ | 0 | 1 |
| 0 | 1 | 0 | 1 | 1 | x | READ | 1 | 0 |
| 0 | 1 | 0 | 0 | 0 | x | WRITE | 0 | 1 |
| 0 | 1 | 0 | 0 | 1 | x | WRITE | 1 | 0 |
| 0 | 0 | 1 | 0 | 0 | 0 | PRECHARGE | 1 | 1 |
| 0 | 0 | 1 | 0 | 1 | 0 | PRECHARGE | 1 | 1 |
| 0 | 0 | 1 | 0 | x | 1 | PRECHARGE | 1 | 1 |
| 0 | 0 | 0 | 0 | x | x | MODE REG SET | 0 | 0 |
| 0 | 0 | 0 | 1 | x | x | REFRESH | 0 | 0 |

In certain embodiments in which the density bit is a row address bit, for read/write commands, the density bit is the value latched during the activate command for the selected bank.

Serial-Presence-Detect Device

Memory modules typically include a serial-presence detect (SPD) device 240 (e.g., an electrically-erasable-programmable read-only memory or EEPROM device) comprising data which characterize various attributes of the memory module, including but not limited to, the number of row addresses the number of column addresses, the data width of the memory devices, the number of ranks, the memory density per rank, the number of memory devices, and the memory density per memory device. The SPD device 240 communicates this data to the basic input/output system (BIOS) of the computer system so that the computer system is informed of the memory capacity and the memory configuration available for use and can configure the memory controller properly for maximum reliability and performance.

For example, for a commercially-available 512-MB (64M×8-byte) memory module utilizing eight 512-Mb memory devices each with a 64M×8-bit configuration, the SPD device contains the following SPD data (in appropriate bit fields of these bytes):

Byte 3: Defines the number of row address bits in the DRAM device in the memory module [13 for the 512-Mb memory device].

Byte 4: Defines the number of column address bits in the DRAM device in the memory module [11 for the 512-Mb memory device].

Byte 13: Defines the bit width of the primary DRAM device used in the memory module [8 bits for the 512-Mb (64M×8-bit) memory device].

Byte 14: Defines the bit width of the error checking DRAM device used in the memory module [8 bits for the 512-Mb (64M×8-bit) memory device].

Byte 17: Defines the number of banks internal to the DRAM device used in the memory module [4 for the 512-Mb memory device].

In a further example, for a commercially-available 1-GB (128M×8-byte) memory module utilizing eight 1-Gb memory devices each with a 128M×8-bit configuration, as described above, the SPD device contains the following SPD data (in appropriate bit fields of these bytes):

Byte 3: Defines the number of row address bits in the DRAM device in the memory module [14 for the 1-Gb memory device].

Byte 4: Defines the number of column address bits in the DRAM device in the memory module [11 for the 1-Gb memory device].

Byte 13: Defines the bit width of the primary DRAM device used in the memory module [8 bits for the 1-Gb (128M×8-bit) memory device].

Byte 14: Defines the bit width of the error checking DRAM device used in the memory module [8 bits for the 1-Gb (128M×8-bit) memory device].

Byte 17: Defines the number of banks internal to the DRAM device used in the memory module [4 for the 1-Gb memory device].

In certain embodiments, the SPD device 240 comprises data which characterize the memory module 10 as having fewer ranks of memory devices than the memory module 10 actually has, with each of these ranks having more memory density. For example, for a memory module 10 compatible with certain embodiments described herein having two ranks of memory devices 30, the SPD device 240 comprises data which characterizes the memory module 10 as having one rank of memory devices with twice the memory density per rank. Similarly, for a memory module 10 compatible with certain embodiments described herein having four ranks of memory devices 30, the SPD device 240 comprises data which characterizes the memory module 10 as having two ranks of memory devices with twice the memory density per rank. In addition, in certain embodiments, the SPD device 240 comprises data which characterize the memory module 10 as having fewer memory devices than the memory module 10 actually has, with each of these memory devices having more memory density per memory device. For example, for a memory module 10 compatible with certain embodiments described herein, the SPD device 240 comprises data which characterizes the memory module 10 as having one-half the number of memory devices that the memory module 10 actually has, with each of these memory devices having twice the memory density per memory device. Thus, in certain embodiments, the SPD device 240 informs the computer system of the larger memory array by reporting a memory device density that is a multiple of the memory devices 30 resident on the memory module 10. Certain embodiments described herein advantageously do not require system level changes to hardware (e.g., the motherboard of the computer system) or to software (e.g., the BIOS of the computer system).

Figure 9C:
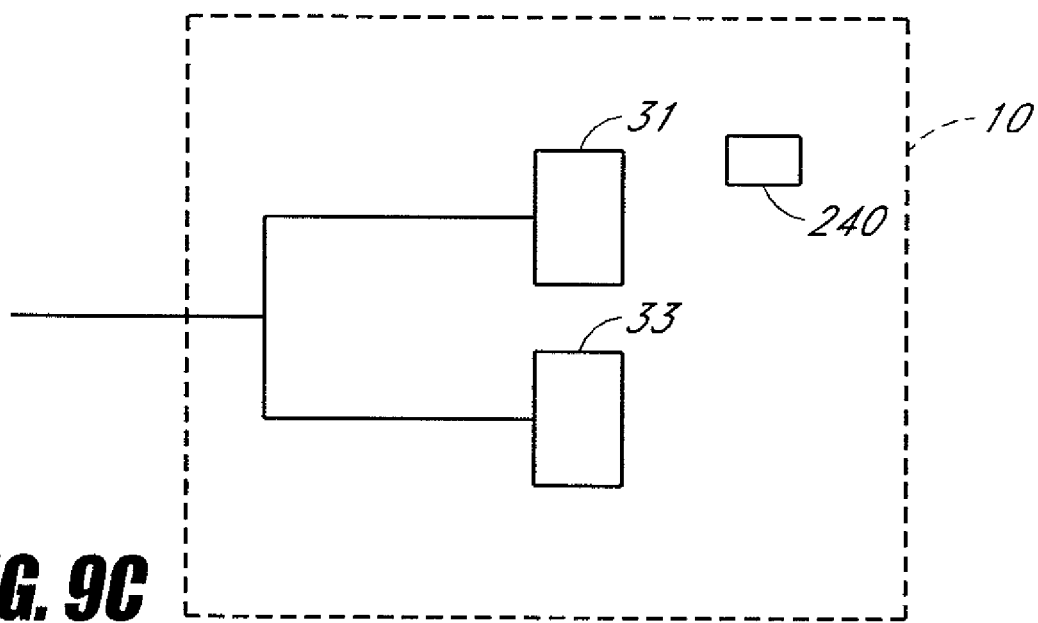
FIG. 9C schematically illustrates another example memory module in accordance with certain embodiments described herein.

FIG. 9C schematically illustrates an exemplary memory module 10 in accordance with certain embodiments described herein. The memory module 10 comprises a pair of substantially identical memory devices 31, 33. Each memory device 31, 33 has a first bit width, a first number of banks of memory locations, a first number of rows of memory locations, and a first number of columns of memory-locations. The memory module 10 further comprises an SPD device 240 comprising data that characterizes the pair of memory devices 31, 33. The data characterize the pair of memory devices 31, 33 as a virtual memory device having a second bit width equal to twice the first bit width, a second number of banks of memory locations equal to the first number of banks, a second number of rows of memory locations equal to the first number of rows, and a second number of columns of memory locations equal to the first number of columns.

In certain such embodiments, the SPD device 240 of the memory module 10 is programmed to describe the combined pair of lower-density memory devices 31, 33 as one virtual or pseudo-higher-density memory device. In an exemplary embodiment, two 512-Mb memory devices, each with a 128M×4-bit configuration, are used to simulate one 1-Gb memory device having a 128M×8-bit configuration. The SPD device 240 of the memory module 10 is programmed to describe the pair of 512-Mb memory devices as one virtual or pseudo-1-Gb memory device.

For example, to fabricate a 1-GB (128M×8-byte) memory module, sixteen 512-Mb (128M×4-bit) memory devices can be used. The sixteen 512-Mb (128M×4-bit) memory devices are combined in eight pairs, with each pair serving as a virtual or pseudo-1-Gb (128M×8-bit) memory device. In certain such embodiments, the SPD device 240 contains the following SPD data (in appropriate bit fields of these bytes):

Byte 3: 13 row address bits.

Byte 4: 12 column address bits.

Byte 13: 8 bits wide for the primary virtual 1-Gb (128M×8-bit) memory device.

Byte 14: 8 bits wide for the error checking virtual 1-Gb (128M×8-bit) memory device.

Byte 17: 4 banks.

In this exemplary embodiment, bytes 3, 4, and 17 are programmed to have the same values as they would have for a 512-MB (128M×4-byte) memory module utilizing 512-Mb (128M×4-bit) memory devices. However, bytes 13 and 14 of the SPD data are programmed to be equal to 8, corresponding to the bit width of the virtual or pseudo-higher-density 1-Gb (128M×8-bit) memory device, for a total capacity of 1-GB. Thus, the SPD data does not describe the actual-lower-density memory devices, but instead describes the virtual or pseudo-higher-density memory devices. The BIOS accesses the SPD data and recognizes the memory module as having 4 banks of memory locations arranged in $2^{13}$ rows and $2^{12}$ columns, with each memory location having a width of 8 bits rather than 4 bits.

In certain embodiments, when such a memory module 10 is inserted in a computer system, the computer system's memory controller then provides to the memory module 10 a set of input address and command signals which correspond to the number of ranks or the number of memory devices reported by the SPD device 240. For example, placing a two-rank memory module 10 compatible with certain embodiments described herein in a computer system compatible with one-rank memory modules, the SPD device 240 reports to the computer system that the memory module 10 only has one rank. The circuit 40 then receives a set of input address and command signals corresponding to a single rank from the computer system's memory controller, and generates and transmits a set of output address and command signals corresponding to two ranks to the appropriate memory devices 30 of the memory module 10.

Similarly, when a two-rank memory module 10 compatible with certain embodiments described herein is placed in a computer system compatible with either one- or two-rank memory modules, the SPD device 240 reports to the computer system that the memory module 10 only has one rank. The circuit 40 then receives a set of input address and command signals corresponding to a single rank from the computer system's memory controller, and generates and transmits a set of output address and command signals corresponding to two ranks to the appropriate memory devices 30 of the memory module 10.

Furthermore, a four-rank memory module 10 compatible with certain embodiments described herein simulates a two-rank memory module whether the memory module 10 is inserted in a computer system compatible with two-rank memory modules or with two- or four-rank memory modules. Thus, by placing a four-rank memory module 10 compatible with certain embodiments described herein in a module slot that is four-rank-ready, the computer system provides four chip-select signals, but the memory module 10 only uses two of the chip-select signals.

In certain embodiments, the circuit 40 comprises the SPD device 240 which reports the CAS latency (CL) to the memory controller of the computer system. The SPD device 240 of certain embodiments reports a CL which has one more cycle than does the actual operational CL of the memory array. In certain embodiments, data transfers between the memory controller and the memory module are registered for one additional clock cycle by the circuit 40. The additional clock cycle of certain embodiments is added to the transfer time budget with an incremental overall CAS latency. This extra cycle of time in certain embodiments advantageously provides sufficient time budget to add a buffer which electrically isolates the ranks of memory devices 30 from the memory controller 20. The buffer of certain embodiments comprises combinatorial logic, registers, and logic pipelines. In certain embodiments, the buffer adds a one-clock cycle time delay, which is equivalent to a registered DIMM, to accomplish the address decoding. The one-cycle time delay of certain such embodiments provides sufficient time for read and write data transfers to provide the functions of the data path multiplexer/demultiplexer. Thus, for example, a DDR2 400-MHz memory system in accordance with embodiments described herein has an overall CAS latency of four, and uses memory devices with a CAS latency of three. In still other embodiments, the SPD device 240 does not utilize this extra cycle of time.

Memory Density Multiplication

In certain embodiments, two memory devices having a memory density are used to simulate a single memory device having twice the memory density, and an additional address signal bit is used to access the additional memory. Similarly, in certain embodiments, two ranks of memory devices having a memory density are used to simulate a single rank of memory devices having twice the memory density, and an additional address signal bit is used to access the additional memory. As used herein, such simulations of memory devices or ranks of memory devices are termed as "memory density multiplication," and the term "density transition bit" is used to refer to the additional address signal bit which is used to access the additional memory by selecting which rank of memory devices is enabled for a read or write transfer operation.

For example, for computer systems which are normally limited to using memory modules which have a single rank of 128M×4-bit memory devices, certain embodiments described herein enable the computer system to utilize memory modules which have double the memory (e.g., two ranks of 128M×4-bit memory devices). The circuit 40 of certain such embodiments provides the logic (e.g., command and address decoding logic) to double the number of chip selects, and the SPD device 240 reports a memory device density of 256M×4-bit to the computer system.

In certain embodiments utilizing memory density multiplication embodiments, the memory module 10 can have various types of memory devices 30 (e.g., DDR1, DDR2, DDR3, and beyond). The circuit 40 of certain such embodiments utilizes implied translation logic equations having variations depending on whether the density transition bit is a row, column, or internal bank address bit. In addition, the translation logic equations of certain embodiments vary depending on the type of memory module 10 (e.g., UDIMM, RDIMM, FBDIMM, etc.). Furthermore, in certain embodiments, the translation logic equations vary depending on whether the implementation multiplies memory devices per rank or multiplies the number of ranks per memory module.

Table 3 A provides the numbers of rows and columns for DDR-1 memory devices, as specified by JEDEC standard JESD79D, "Double Data Rate (DDR) SDRAM Specification," published February 2004, and incorporated in its entirety by reference herein.

TABLE 3A

|  | 128-Mb | 256-Mb | 512-Mb | 1-Gb |
|---|---|---|---|---|
| Number of banks | 4 | 4 | 4 | 4 |
| Number of row address bits | 12 | 13 | 13 | 14 |
| Number of column address bits for "x4" configuration | 11 | 11 | 12 | 12 |
| Number of column address bits for "x8" configuration | 10 | 10 | 11 | 11 |
| Number of column address bits for "x16" configuration | 9 | 9 | 10 | 10 |

As described by Table 3A, 512-Mb (128M×4-bit) DRAM devices have $2^{13}$ rows and $2^{12}$ columns of memory locations, while 1-Gb (128M×8-bit) DRAM devices have $2^{14}$ rows and $2^{11}$ columns of memory locations. Because of the differences in the number of rows and the number of columns for the two types of memory devices, complex address translation procedures and structures would typically be needed to fabricate a 1-GB (128M×8-byte) memory module using sixteen 512-Mb (128M×4-bit) DRAM devices.

Table 3B shows the device configurations as a function of memory density for DDR2 memory devices.

TABLE 3B

|  | Number of Rows | Number of Columns | Number of Internal Banks | Page Size (x4s or x8s) |
|---|---|---|---|---|
| 256 Mb | 13 | 11 | 4 | 1 KB |
| 512 Mb | 14 | 11 | 4 | 1 KB |
| 1 Gb | 14 | 11 | 8 | 1 KB |
| 2 Gb | 15 | 11 | 8 | 1 KB |
| 4 Gb | 16 | 11 | 8 | 1 KB |

Table 4 lists the corresponding density transition bit for the density transitions between the DDR2 memory densities of Table 3B.

TABLE 4

| Density Transition | Density Transition Bit |
|---|---|
| 256 Mb to 512 Mb | $A_{13}$ |
| 512 Mb to 1 Gb | $BA_2$ |
| 1 Gb to 2 Gb | $A_{14}$ |
| 2 Gb to 4 Gb | $A_{15}$ |

Other certain embodiments described herein utilize a transition bit to provide a transition from pairs of physical 4-Gb memory devices to simulated 8-Gb memory devices.

In an example embodiment, the memory module comprises one or more pairs of 256-Mb memory devices, with each pair simulating a single 512-Mb memory device. The simulated 512-Mb memory device has four internal banks while each of the two 256-Mb memory devices has four internal banks, for a total of eight internal banks for the pair of 256-Mb memory devices. In certain embodiments, the additional row address bit is translated by the circuit 40 to the rank selection between each of the two 256-Mb memory devices of the pair. Although there are eight total internal banks in the rank-converted memory array, the computer system is only aware of four internal banks. When the memory controller activates a row for a selected bank, the circuit 40 activates the same row for the same bank, but it does so for the selected rank according to the logic state of the additional row address bit $A_{13}$.

In another example embodiment, the memory module comprises one or more pairs of 512-Mb memory devices, with each pair simulating a single 1-Gb memory device. The simulated 1-Gb memory device has eight internal banks while each of the two 512-Mb memory devices has four internal banks, for a total of eight internal banks for the pair of 512-Mb memory devices. In certain embodiments, the mapped $BA_2$ (bank 2) bit is used to select between the two ranks of 512-Mb memory devices to preserve the internal bank geometry expected by the memory controller of the computer system. The state of the $BA_2$ bit selects the upper or lower set of four banks, as well as the upper and lower 512-Mb rank.

In another example embodiment, the memory module comprises one or more pairs of 1-Gb memory devices, with each pair simulating a single 2-Gb memory device. Each of the two 1-Gb memory devices has eight internal banks for a total of sixteen internal banks, while the simulated 2-Gb memory device has eight internal banks. In certain embodiments, the additional row address bit translates to the rank selection between the two 1-Gb memory devices. Although there are sixteen total internal banks per pair of 1-Gb memory devices in the rank-converted memory array, the memory controller of the computer system is only aware of eight internal banks. When the memory controller activates a row of a selected bank, the circuit 40 activates the same row for the same bank, but is does so for the selected rank according to the logic state of the additional row address bit $A_{14}$.

The circuit 40 of certain embodiments provides substantially all of the translation logic used for the decoding (e.g., command and address decoding). In certain such embodiments, there is a fully transparent operational conversion from the "system memory" density domain of the computer system to the "physical memory" density domain of the memory module 10. In certain embodiments, the logic translation equations are programmed in the circuit 40 by hardware, while in certain other embodiments, the logic translation equations are programmed in the circuit 40 by software. Examples 1 and 2 provide exemplary sections of Verilog code compatible with certain embodiments described herein. As described more fully below, the code of Examples 1 and 2 includes logic to reduce potential problems due to "back-to-back adjacent read commands which cross memory device boundaries or "BBARX." Persons skilled in the art are able to provide additional logic translation equations compatible with embodiments described herein.

An exemplary section of Verilog code compatible with memory density multiplication from 512 Mb to 1 Gb using DDR2 memory devices with the $BA_2$ density transition bit is listed below in Example 2. The exemplary code of Example 2 corresponds to a circuit 40 which receives one chip-select signal from the computer system and which generates two chip-select signals.

EXAMPLE 2

```
always @(posedge clk_in)
    begin
            rs0N_R <= rs0_in_N;    // cs0
            rasN_R <= ras_in_N;
            casN_R <= cas_in_N;
            weN_R <= we_in_N;
    end
// Gated Chip Selects
assign          pcs0a_1 = (~rs0_in_N & ~ras_in_N & ~cas_in_N)                              // ref,md reg set
                | (~rs0_in_N & ras_in_N & cas_in_N)                                         // ref exit, pwr dn
                | (~rs0_in_N & ~ras_in_N & cas_in_N & ~we_in_N & a10_in)                    // pchg all
                | (~rs0_in_N & ~ras_in_N & cas_in_N & ~we_in_N & ~a10_in & ~ba2_in)         // pchg single bnk
                | (~rs0_in_N & ~ras_in_N & cas_in_N & we_in_N      & ~ba2_in)               // activate
                | (~rs0_in_N & ras_in_N & ~cas_in_N           & ~ba2_in)                    // xfr
                ;
assign          pcs0b_1 = (~rs0_in_N & ~ras_in_N & ~cas_in_N)                              // ref,md reg set
                | (~rs0_in_N & ras_in_N & cas_in_N)                                         // ref exit, pwr dn
                | (~rs0_in_N & ~ras_in_N & cas_in_N & ~we_in_N & a10_in)                    // pchg all
                | (~rs0_in_N & ~ras_in_N & cas_in_N & ~we_in_N & ~a10_in & ba2_in)          // pchg single bnk
                | (~rs0_in_N & ~ras_in_N & cas_in_N & we_in_N      & ba2_in)                // activate
                | (~rs0_in_N & ras_in_N & ~cas_in_N           & ba2_in) // xfr
                ;
//-----------------------------------
```

```
    always @(posedge clk_in)
       begin
                    a4_r <= a4_in ;
                    a5_r <= a5_in ;
                    a6_r <= a6_in ;
                    a10_r <= a10_in ;
                    ba0_r <= ba0_in ;
                    ba1_r <= ba1_in ;
                    ba2_r <= ba2_in ;
                    q_mrs_cmd_cyc1 <= q_mrs_cmd ;
       end
///////////////////////////////////////////////////////////////
// determine the cas latency
///////////////////////////////////////////////////////////////
assign q_mrs_cmd_r = (!rasN_R & !casN_R & !weN_R)
                    & !rs0N_R
                    & (!ba0_r & !ba1_r)
                    ;       // md reg set cmd
    always @(posedge clk_in)
         if (~reset_N)      // lmr
                    cl3 <= 1'b1 ;
         else if (q_mrs_cmd_cyc1)   // load mode reg cmd
           begin
                    cl3 <= (~a6_r & a5_r & a4_r ) ;
           end
    always @(posedge clk_in)
         if (~reset_N)      // reset
                    cl2 <= 1'b0 ;
         else if (q_mrs_cmd_cyc1)   // load mode reg cmd
           begin
                    cl2 <= (~a6_r & a5_r & ~a4_r ) ;
           end
    always @(posedge clk_in)
         if (~reset_N)      // reset
                    cl4 <= 1'b0 ;
         else if (q_mrs_cmd_cyc1)   // load mode reg cmd
           begin
                    cl4 <= (a6_r & ~a5_r & ~a4_r ) ;
           end
  always @(posedge clk_in)
         if (~reset_N)           cl5 <= 1'b0 ;
         else if (q_mrs_cmd_cyc1)   // load mode reg cmd
           begin
                    cl5 <= (a6_r & ~a5_r & a4_r ) ;
           end
assign          pre_cyc2_enfet = (wr_cmd_cyc1 & acs_cyc1 & cl3)     // wr brst cl3 preamble
                    ;
assign          pre_cyc3_enfet = (rd_cmd_cyc2 & cl3)                // rd brst cl3 preamble
                    | (wr_cmd_cyc2 & cl3)                           // wr brst cl3 1st pair
                    | (wr_cmd_cyc2 & cl4)                           // wr brst cl4 preamble
                    ;
assign          pre_cyc4_enfet = (wr_cmd_cyc3 & cl3)                // wr brst cl3 2nd pair
                    | (wr_cmd_cyc3 & cl4)                           // wr brst cl4 1st pair
                    | (rd_cmd_cyc3 & cl3)                           // rd brst cl3 1st pair
                    | (rd_cmd_cyc3 & cl4)                           // rd brst cl4 preamble
                    ;
assign          pre_cyc5_enfet = (rd_cmd_cyc4 & cl3)                // rd brst cl3 2nd pair
                    | (wr_cmd_cyc4 & cl4)                           // wr brst cl4 2nd pair
                    | (rd_cmd_cyc4 & cl4)                           // rd brst cl4 1st pair
                    ;
// dq
assign          pre_dq_cyc = pre_cyc2_enfet
                    | pre_cyc3_enfet
                    | pre_cyc4_enfet
                    | pre_cyc5_enfet
                    ;
assign          pre_dq_ncyc = enfet_cyc2
                    | enfet_cyc3
                    | enfet_cyc4
                    | enfet_cyc5
                    ;
// dqs
assign          pre_dqsa_cyc = (pre_cyc2_enfet & ~ba2_r)
                    | (pre_cyc3_enfet & ~ba2_cyc2)
                    | (pre_cyc4_enfet & ~ba2_cyc3)
                    | (pre_cyc5_enfet & ~ba2_cyc4)
                    ;
assign          pre_dqsb_cyc = (pre_cyc2_enfet & ba2_r)
                    | (pre_cyc3_enfet & ba2_cyc2)
```

```
                    | (pre_cyc4_enfet & ba2_cyc3)
                    | (pre_cyc5_enfet & ba2_cyc4)
                    ;
assign          pre_dqsa_ncyc = (enfet_cyc2 & ~ba2_cyc2)
                    | (enfet_cyc3 & ~ba2_cyc3)
                    | (enfet_cyc4 & ~ba2_cyc4)
                    | (enfet_cyc5 & ~ba2_cyc5)
                    ;
assign          pre_dqsb_ncyc = (enfet_cyc2 & ba2_cyc2)
                    | (enfet_cyc3 & ba2_cyc3)
                    | (enfet_cyc4 & ba2_cyc4)
                    | (enfet_cyc5 & ba2_cyc5)
                    ;
always @(posedge clk_in)
    begin
        acs_cyc2 <= acs_cyc1 ;       // cs active
        ba2_cyc2 <= ba2_r ;
        ba2_cyc3 <= ba2_cyc2 ;
        ba2_cyc4 <= ba2_cyc3 ;
        ba2_cyc5 <= ba2_cyc4 ;
        rd_cmd_cyc2 <= rd_cmd_cyc1 & acs_cyc1;
        rd_cmd_cyc3 <= rd_cmd_cyc2 ;
        rd_cmd_cyc4 <= rd_cmd_cyc3 ;
        rd_cmd_cyc5 <= rd_cmd_cyc4 ;
        rd_cmd_cyc6 <= rd_cmd_cyc5 ;
        rd_cmd_cyc7 <= rd_cmd_cyc6 ;
        wr_cmd_cyc2 <= wr_cmd_cyc1 & acs_cyc1;
        wr_cmd_cyc3 <= wr_cmd_cyc2 ;
        wr_cmd_cyc4 <= wr_cmd_cyc3 ;
        wr_cmd_cyc5 <= wr_cmd_cyc4 ;
    end
always @(negedge clk_in)
    begin
        dq_ncyc <= dq_cyc;
        dqs_ncyc_a <= dqs_cyc_a;
        dqs_ncyc_b <= dqs_cyc_b;
    end
// DQ FET enables
assign          enq_fet1 = dq_cyc | dq_ncyc           ;
assign          enq_fet2 = dq_cyc | dq_ncyc ;
assign      enq_fet3 = dq_cyc | dq_ncyc           ;
assign          enq_fet4 = dq_cyc | dq_ncyc ;
assign          enq_fet5 = dq_cyc | dq_ncyc ;
// DQS FET enables
assign          ens_fet1a = dqs_cyc_a | dqs_ncyc_a    ;
assign          ens_fet2a = dqs_cyc_a | dqs_ncyc_a    ;
assign          ens_fet3a = dqs_cyc_a | dqs_ncyc_a    ;
assign          ens_fet1b = dqs_cyc_b | dqs_ncyc_b    ;
assign          ens_fet2b = dqs_cyc_b | dqs_ncyc_b    ;
assign          ens_fet3b = dqs_cyc_b | dqs_ncyc_b    ;
```

Another exemplary section of Verilog code compatible with memory density multiplication from 256 Mb to 512 Mb using DDR2 memory devices and gated CAS signals with the row $A_{13}$ density transition bit is listed below in Example 3. The exemplary code of Example 3 corresponds to a circuit 40 which receives one gated CAS signal from the computer system and which generates two gated CAS signals.

EXAMPLE 3

```
// latched a13 flags cs0, banks 0-3
    always @(posedge clk_in)
        if (actv_cmd_R & ~rs0N_R & ~bnk1_R & ~bnk0_R)    // activate
        begin
            l_a13_00 <= a13_r ;
        end
    always @(posedge clk_in)
        if (actv_cmd_R & ~rs0N_R & ~bnk1_R & bnk0_R)     // activate
        begin
            l_a13_01 <= a13_r ;
        end
    always @(posedge clk_in)
        if (actv_cmd_R & ~rs0N_R & bnk1_R & ~bnk0_R)     // activate
        begin
            l_a13_10 <= a13_r ;
```

-continued

```
            end
        always @(posedge clk_in)
            if (actv_cmd_R & ~rs0N_R & bnk1_R & bnk0_R)         // activate
            begin
                    1_a13_11 <= a13_r ;
            end
// gated cas
assign cas_i = ~(casN_R);
assign cas0_o = ( ~rasN_R & cas_i)
                | ( rasN_R & ~1_a13_00 & ~bnk1_R & ~bnk0_R & cas_i)
                | ( rasN_R & ~1_a13_01 & ~bnk1_R & bnk0_R & cas_i)
                | ( rasN_R & ~1_a13_10 & bnk1_R & ~bnk0_R & cas_i)
                | ( rasN_R & ~1_a13_11 & bnk1_R & bnk0_R & cas_i)
                ;
assign cas1_o = ( ~rasN_R & cas_i)
                | ( rasN_R & 1_a13_00      & ~bnk1_R & ~bnk0_R & cas_i)
                | ( rasN_R & 1_a13_01      & ~bnk1_R & bnk0_R & cas_i)
                | ( rasN_R & 1_a13_10      & bnk1_R & ~bnk0_R & cas_i)
                | ( rasN_R & 1_a13_11      & bnk1_R & bnk0_R & cas_i)
                ;
assign      pcas_0_N = ~cas0_o;
assign      pcas_1_N = ~cas1_o;
assign      rd0_o_R1 = rasN_R & cas0_o & weN_R & ~rs0N_R; // rnk0 rd cmd cyc
assign      rd1_o_R1 = rasN_R & cas1_o & weN_R & ~rs0N_R; // rnk1 rd cmd cyc
assign      wr0_o_R1 = rasN_R & cas0_o & ~weN_R & ~rs0N_R; // rnk0 wr cmd cyc
assign      wr1_o_R1 = rasN_R & cas1_o & ~weN_R & ~rs0N_R ; // rnk1 wr cmd cyc
        always @(posedge clk_in)
            begin
                    rd0_o_R2 <= rd0_o_R1 ;
                    rd0_o_R3 <= rd0_o_R2;
                    rd0_o_R4 <= rd0_o_R3;
                    rd0_o_R5 <= rd0_o_R4;
                    rd1_o_R2 <= rd1_o_R1 ;
                    rd1_o_R3 <= rd1_o_R2;
                    rd1_o_R4 <= rd1_o_R3;
                    rd1_o_R5 <= rd1_o_R4;
                    wr0_o_R2 <= wr0_o_R1 ;
                    wr0_o_R3 <= wr0_o_R2;
                    wr0_o_R4 <= wr0_o_R3;
                    wr1_o_R2 <= wr1_o_R1 ;
                    wr1_o_R3 <= wr1_o_R2;
                    wr1_o_R4 <= wr1_o_R3;
            end
        always @(posedge clk_in)
            begin
                if (
                        (rd0_o_R2 & ~rd1_o_R4)                      // pre-am rd if no ped on rnk 1
                    | rd0_o_R3                                       // 1st cyc of rd brst
                    | rd0_o_R4                                       // 2nd cyc of rd brst
                    | (rd0_o_R5 & ~rd1_o_R2 & ~rd1_o_R3)             // post-rd cyc if no ped on rnk 1
                    | (wr0_o_R1)                                     // pre-am wr
                    | wr0_o_R2 | wr0_o_R3                            // wr brst 1st & 2nd cyc
                    | (wr0_o_R4)                                     // post-wr cyc (chgef9)
                    | wr1_o_R1 | wr1_o_R2 | wr1_o_R3 | wr1_o_R4      // rank 1 (chgef9)
                    )
                                en_fet_a <= 1'b1;                    // enable fet
                else
                                en_fet_a <= 1'b0;                    // disable fet
            end
        always @(posedge clk_in)
                begin
                    if (
                            (rd1_o_R2 & ~rd0_o_R4)
                        | rd1_o_R3
                        | rd1_o_R4
                        | (rd1_o_R5 & ~rd0_o_R2 & ~rd0_o_R3)
                        | (wr1_o_R1)                                 // (chgef8)
                        | wr1_o_R2 | wr1_o_R3
    | (wr1_o_R4)                                                     // post-wr cyc    (chgef9)
    | wr0_o_R1 | wr0_o_R2 | wr0_o_R3 | wr0_o_R4                      // rank 0 (chgef9)
                        )
                                en_fet_b <= 1'b1;                    //
                    else
                                en_fet_b <= 1'b0;
                    end
```

In certain embodiments, the chipset memory controller of the computer system uses the inherent behavioral characteristics of the memory devices (e.g., DDR2 memory devices) to optimize throughput of the memory system. For example, for each internal bank in the memory array, a row (e.g., 1 KB page) is advantageously held activated for an extended period of time. The memory controller, by anticipating a high number of memory accesses or hits to a particular region of memory, can exercise this feature to advantageously eliminate time-consuming pre-charge cycles. In certain such embodiments in which two half-density memory devices are transparently substituted for a single full-density memory device (as reported by the SPD device 240 to the memory controller), the memory devices advantageously support the "open row" feature.

Figure 10A:
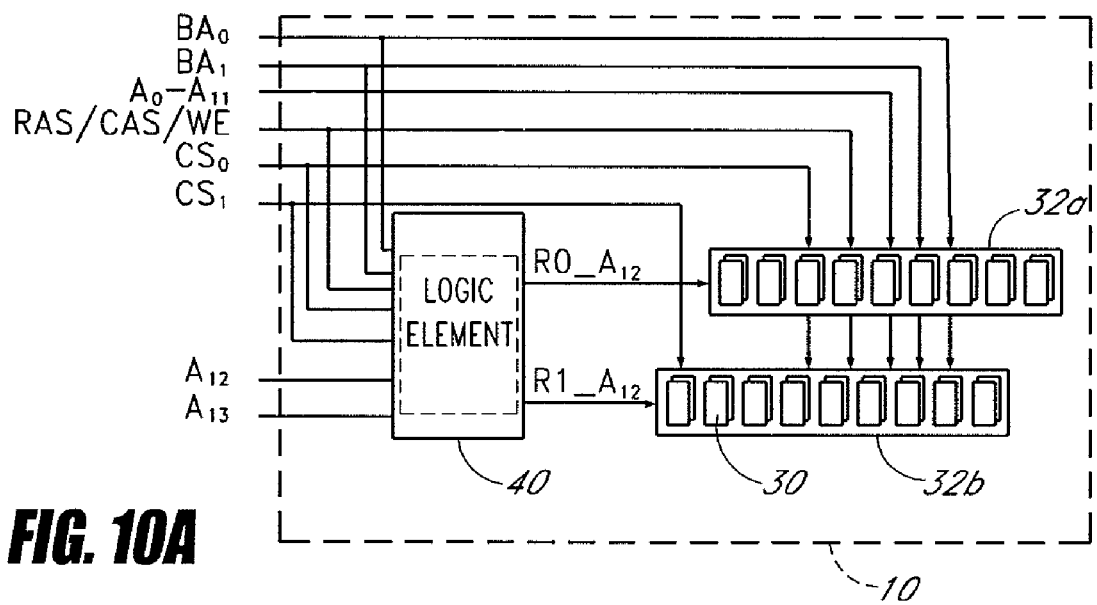
FIG. 10A schematically illustrates an exemplary memory module which doubles the rank density in accordance with certain embodiments described herein.

FIG. 10A schematically illustrates an exemplary memory module 10 which doubles the rank density in accordance with certain embodiments described herein. The memory module 10 has a first memory capacity. The memory module 10 comprises a plurality of substantially identical memory devices 30 configured as a first rank 32*a* and a second rank 32*b*. In certain embodiments, the memory devices 30 of the first rank 32*a* are configured in pairs, and the memory devices 30 of the second rank 32*b* are also configured in pairs. In certain embodiments, the memory devices 30 of the first rank 32*a* are configured with their respective DQS pins tied together and the memory devices 30 of the second rank 32*b* are configured with their respective DQS pins tied together, as described more fully below. The memory module 10 further comprises a circuit 40 which receives a first set of address and command signals from a memory controller (not shown) of the computer system. The first set of address and command signals is compatible with a second memory capacity substantially equal to one-half of the first memory capacity. The circuit 40 translates the first set of address and command signals into a second set of address and command signals which is compatible with the first memory capacity of the memory module 10 and which is transmitted to the first rank 32*a* and the second rank 32*b*.

The first rank 32*a* of FIG. 10A has 18 memory devices 30 and the second rank 32*b* of FIG. 10A has 18 memory devices 30. Other numbers of memory devices 30 in each of the ranks 32*a*, 32*b* are also compatible with embodiments described herein.

In the embodiment schematically illustrated by FIG. 10A, the memory module 10 has a width of 8 bytes (or 64 bits) and each of the memory devices 30 of FIG. 10A has a bit width of 4 bits. The 4-bit-wide ("×4") memory devices 30 of FIG. 10A have one-half the width, but twice the depth of 8-bit-wide ("×8") memory devices. Thus, each pair of "×4" memory devices 30 has the same density as a single "×8" memory device, and pairs of "×4" memory devices 30 can be used instead of individual "×8" memory devices to provide the memory density of the memory module 10. For example, a pair of 512-Mb 128M×4-bit memory devices has the same memory density as a 1-Gb 128M×8-bit memory device.

For two "×4 " memory devices 30 to work in tandem to mimic a "×8" memory device, the relative DQS pins of the two memory devices 30 in certain embodiments are advantageously tied together, as described more fully below. In addition, to access the memory density of a high-density memory module 10 comprising pairs of "×4" memory devices 30, an additional address line is used. While a high-density memory module comprising individual "×8" memory devices with the next-higher density would also utilize an additional address line, the additional address lines are different in the two memory module configurations.

For example, a 1-Gb 128M×8-bit DDR-1 DRAM memory device uses row addresses $A_{13}$-$A_0$ and column addresses $A_{11}$ and $A_9$-$A_0$. A pair of 512-Mb 128M×4-bit DDR-1 DRAM memory devices uses row addresses $A_{12}$-$A_0$ and column addresses $A_{12}$, $A_{11}$, and $A_9$-$A_0$. In certain embodiments, a memory controller of a computer system utilizing a 1-GB 128M×8 memory module 10 comprising pairs of the 512-Mb 128M×4 memory devices 30 supplies the address and command signals including the extra row address ($A_{13}$) to the memory module 10. The circuit 40 receives the address and command signals from the memory controller and converts the extra row address ($A_{13}$) into an extra column address ($A_{12}$).

Figure 10B:
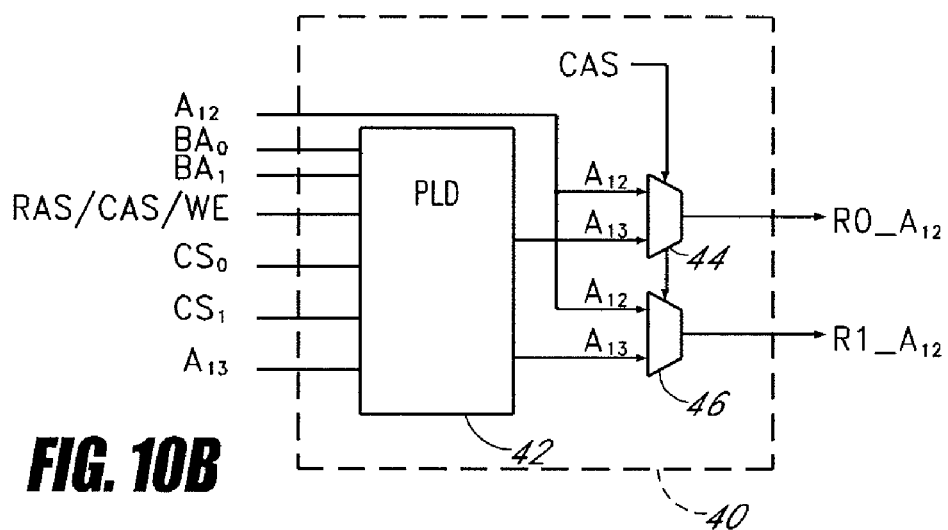
FIG. 10B schematically illustrates an exemplary circuit compatible with embodiments described herein.

FIG. 10B schematically illustrates an exemplary circuit 40 compatible with embodiments described herein. The circuit 40 is used for a memory module 10 comprising pairs of "×4" memory devices 30 which mimic individual "×8" memory devices. In certain embodiments, each pair has the respective DQS pins of the memory devices 30 tied together. In certain embodiments, as schematically illustrated by FIG. 10B, the circuit 40 comprises a programmable-logic device (PLD) 42, a first multiplexer 44 electrically coupled to the first rank 32*a* of memory devices 30, and a second multiplexer 46 electrically coupled to the second rank 32*b* of memory devices 30. In certain embodiments, the PLD 42 and the first and second multiplexers 44, 46 are discrete elements, while in other certain embodiments, they are integrated within a single integrated circuit. Persons skilled in the art can select an appropriate PLD 42, first multiplexer 44, and second multiplexer 46 in accordance with embodiments described herein.

In the exemplary circuit 40 of FIG. 10B, during a row access procedure (CAS is high), the first multiplexer 44 passes the $A_{12}$ address through to the first rank 32, the second multiplexer 46 passes the $A_{12}$ address through to the second rank 34, and the PLD 42 saves or latches the $A_{13}$ address from the memory controller. In certain embodiments, a copy of the $A_{13}$ address is saved by the PLD 42 for each of the internal banks (e.g., 4 internal banks) per memory device 30. During a subsequent column access procedure (CAS is low), the first multiplexer 44 passes the previously-saved $A_{13}$ address through to the first rank 32*a* as the $A_{12}$ address and the second multiplexer 46 passes the previously-saved $A_{13}$ address through to the second rank 32*b* as the $A_{12}$ address. The first rank 32*a* and the second rank 32*b* thus interpret the previously-saved $A_{13}$ row address as the current $A_{12}$ column address. In this way, in certain embodiments, the circuit 40 translates the extra row address into an extra column address in accordance with certain embodiments described herein.

Thus, by allowing two lower-density memory devices to be used rather than one higher-density memory device, certain embodiments described herein provide the advantage of using lower-cost, lower-density memory devices to build "next-generation" higher-density memory modules. Certain embodiments advantageously allow the use of lower-cost readily-available 512-Mb DDR-2 SDRAM devices to replace more expensive 1-Gb DDR-2 SDRAM devices. Certain embodiments advantageously reduce the total cost of the resultant memory module.

Figure 11A:
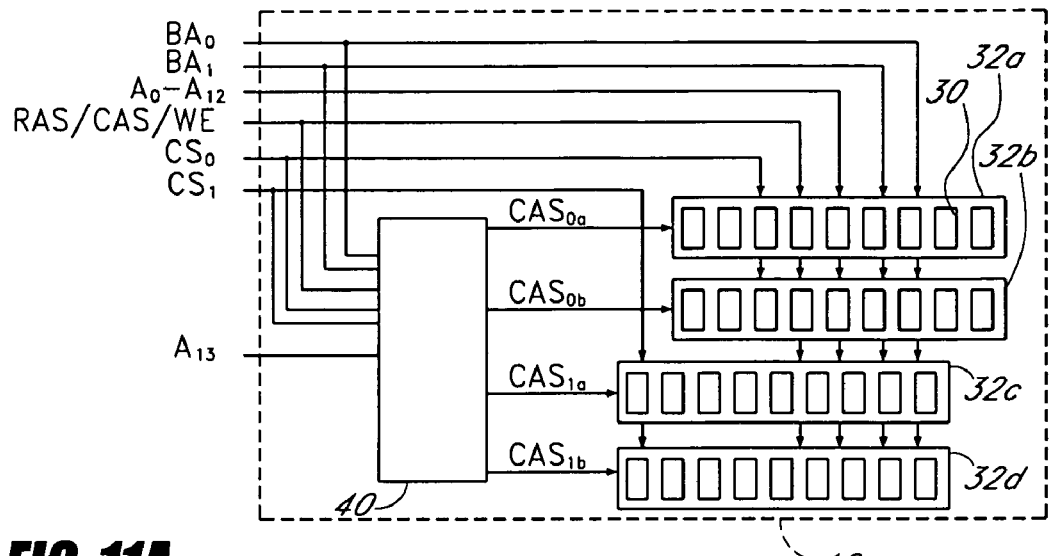
FIG. 11A schematically illustrates an exemplary memory module which doubles number of ranks in accordance with certain embodiments described herein.

FIG. 11A schematically illustrates an exemplary memory module 10 which doubles number of ranks in accordance with certain embodiments described herein. The memory module 10 has a first plurality of memory locations with a first memory density. The memory module 10 comprises a plurality of substantially identical memory devices 30 configured as a first rank 32*a*, a second rank 32*b*, a third rank 32*c*, and a fourth rank 32*d*. The memory module 10 further comprises a circuit 40 which receives a first set of address and command signals from a memory controller (not shown). The first set of address and command signals is compatible with a second plurality of memory locations having a second memory density. The second memory density is substantially equal to one-half of the first memory density. The circuit 40 translates the first set of address and command signals into a second set of address and command signals which is compatible with the first plurality of memory locations of the memory module 10 and which is transmitted to the first rank 32a, the second rank 32b, the third rank 32c, and the fourth rank 32d.

Each rank 32a, 32b, 32c, 32d of FIG. 11A has 9 memory devices 30. Other numbers of memory devices 30 in each of the ranks 32a, 32b, 32c, 32d are also compatible with embodiments described herein.

In the embodiment schematically illustrated by FIG. 11A, the memory module 10 has a width of 8 bytes (or 64 bits) and each of the memory devices 30 of FIG. 11A has a bit width of 8 bits. Because the memory module 10 has twice the number of 8-bit-wide ("×8") memory devices 30 as does a standard 8-byte-wide memory module, the memory module 10 has twice the density as does a standard 8-byte-wide memory module. For example, a 1-GB 128M×8-byte memory module with 36 512-Mb 128M×8-bit memory devices (arranged in four ranks) has twice the memory density as a 512-Mb 128M×8-byte memory module with 18 512-Mb 128M×8-bit-memory devices (arranged in two ranks).

Figure 11B:
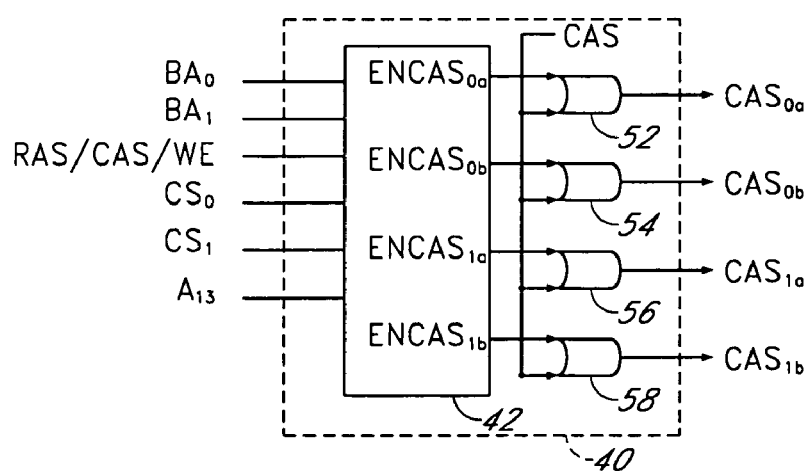
FIG. 11B schematically illustrates an exemplary circuit compatible with embodiments described herein.

To access the additional memory density of the high-density memory module 10, the two chip-select signals ($CS_0$, $CS_1$) are used with other address and command signals to gate a set of four gated CAS signals. For example, to access the additional ranks of four-rank 1-GB 128M×8-byte DDR-1 DRAM memory module, the $CS_0$ and $CS_1$ signals along with the other address and command signals are used to gate the CAS signal appropriately, as schematically illustrated by FIG. 11A. FIG. 11B schematically illustrates an exemplary circuit 40 compatible with embodiments described herein. In certain embodiments, the circuit 40 comprises a programmable-logic device (PLD) 42 and four "OR" logic elements 52, 54, 56, 58 electrically coupled to corresponding ranks 32a, 32b, 32c, 32d of memory devices 30.

In certain embodiments, the PLD 42 comprises an ASIC, an FPGA, a custom-designed semiconductor device, or a CPLD. In certain embodiments, the PLD 42 and the four "OR" logic elements 52, 54, 56, 58 are discrete elements, while in other certain embodiments, they are integrated within a single integrated circuit. Persons skilled in the art can select an appropriate PLD 42 and appropriate "OR" logic elements 52, 54, 56, 58 in accordance with embodiments described herein.

In the embodiment schematically illustrated by FIG. 11B, the PLD 42 transmits each of the four "enabled CAS" ($ENCAS_0a$, $ENCAS_0b$, $ENCAS_1a$, $ENCAS_1b$) signals to a corresponding one of the "OR" logic elements 52, 54, 56, 58. The CAS signal is also transmitted to each of the four "OR" logic elements 52, 54, 56, 58. The CAS signal and the "enabled CAS" signals are "low" true signals. By selectively activating each of the four "enabled CAS" signals which are inputted into the four "OR" logic elements 52, 54, 56, 58, the PLD 42 is able to select which of the four ranks 32a, 32b, 32c, 32d is active.

In certain embodiments, the PLD 42 uses sequential and combinatorial logic procedures to produce the gated CAS signals which are each transmitted to a corresponding one of the four ranks 32a, 32b, 32c, 32d. In certain other embodiments, the PLD 42 instead uses sequential and combinatorial logic procedures to produce four gated chip-select signals (e.g., $CS_0a$, $CS_0b$, $CS_1a$, and $CS_1b$) which are each transmitted to a corresponding one of the four ranks 32a, 32b, 32c, 32d.

Tied Data Strobe Signal Pins

For proper operation, the computer system advantageously recognizes a 1-GB memory module comprising 256-Mb memory devices with 64M×4-bit configuration as a 1-GB memory module having 512-Mb memory devices with 64M×8-bit configuration (e.g., as a 1-GB memory module with 128M×8-byte configuration). This advantageous result is desirably achieved in certain embodiments by electrically connecting together two output signal pins (e.g., DQS or data strobe pins) of the two 256-Mb memory devices such that both output signal pins are concurrently active when the two memory devices are concurrently enabled. The DQS or data strobe is a bi-directional signal that is used during both read cycles and write cycles to validate or latch data. As used herein, the terms "tying together" or "tied together" refer to a configuration in which corresponding pins (e.g., DQS pins) of two memory devices are electrically connected together and are concurrently active when the two memory devices are concurrently enabled (e.g., by a common chip-select or CS signal). Such a configuration is different from standard memory module configurations in which the output signal pins (e.g., DQS pins) of two memory devices are electrically coupled to the same source, but these pins are not concurrently active since the memory devices are not concurrently enabled. However, a general guideline of memory module design warns against tying together two output signal pins in this way.

Figure 12:
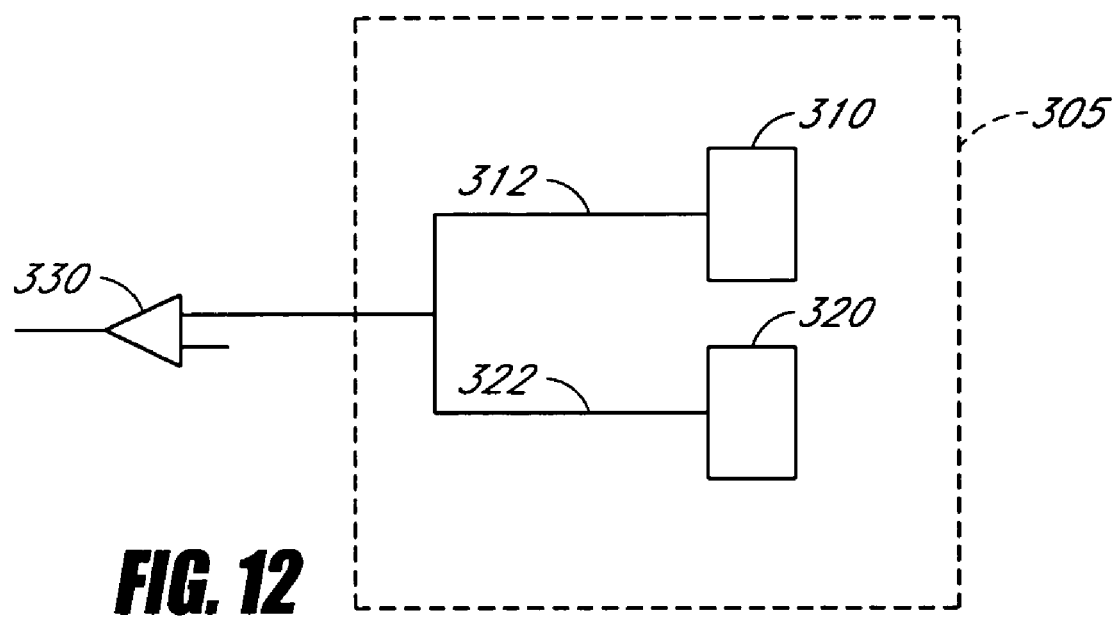
FIG. 12 schematically illustrates an exemplary memory module in which a data strobe (DQS) pin of a first memory device is electrically connected to a DQS pin of a second memory device while both DQS pins are active.
Figure 13:
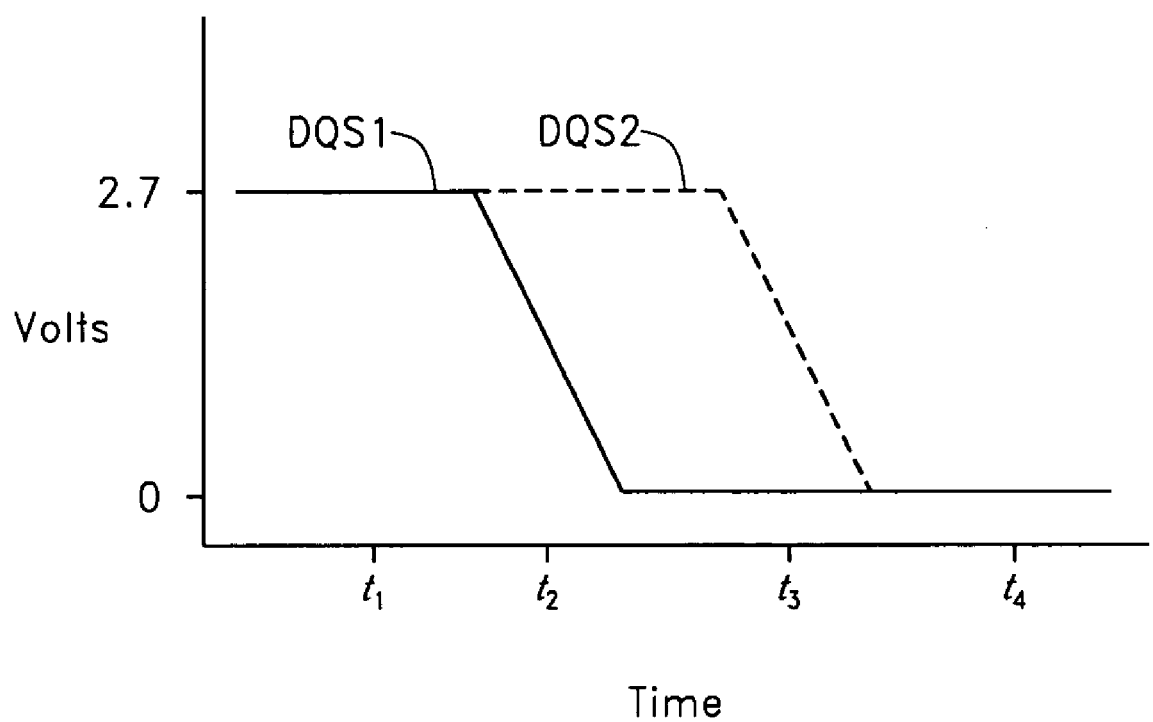
FIG. 13 is an exemplary timing diagram of the voltages applied to the two DQS pins due to non-simultaneous switching.

FIGS. 12 and 13 schematically illustrate a problem which may arise from tying together two output signal pins. FIG. 12 schematically illustrates an exemplary memory module 305 in which a first DQS pin 312 of a first memory device 310 is electrically connected to a second DQS pin 322 of a second memory device 320. The two DQS pins 312, 322 are both electrically connected to a memory controller 330.

FIG. 13 is an exemplary timing diagram of the voltages applied to the two DQS pins 312, 322 due to non-simultaneous switching. As illustrated by FIG. 13, at time $t_1$, both the first DQS pin 312 and the second DQS pin 322 are high, so no current flows between them. Similarly, at time $t_4$, both the first DQS pin 312 and the second DQS pin 322 are low, so no current flows between them. However, for times between approximately $t_2$ and approximately $t_3$, the first DQS pin 312 is low while the second DQS pin 322 is high. Under such conditions, a current will flow between the two DQS pins 312, 322. This condition in which one DQS pin is low while the other DQS pin is high can occur for fractions of a second (e.g., 0.8 nanoseconds) during the dynamic random-access memory (DRAM) read cycle. During such conditions, the current flowing between the two DQS pins 312, 322 can be substantial, resulting in heating of the memory devices 310, 320, and contributing to the degradation of reliability and eventual failure of these memory devices.

Figure 14:
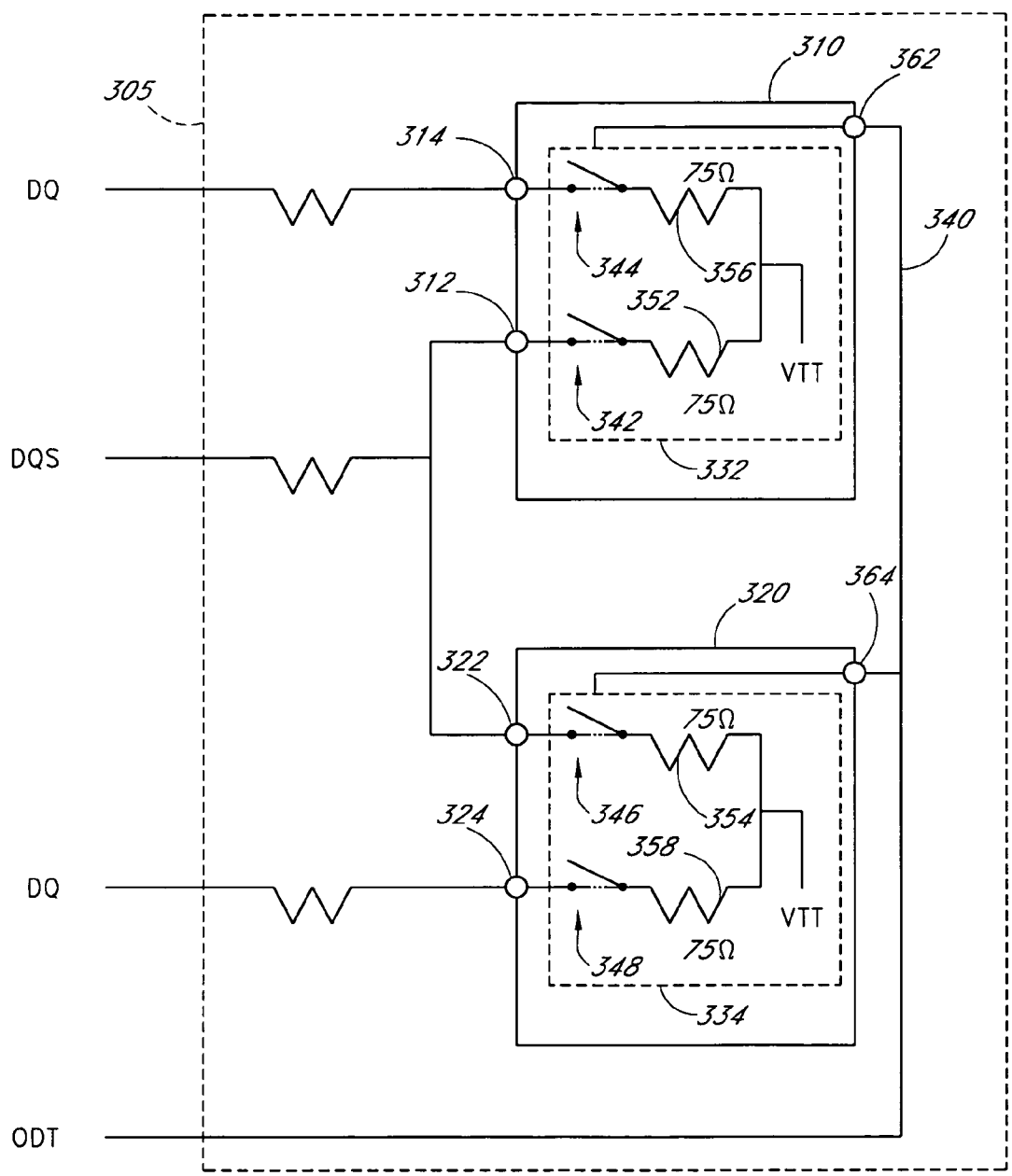
FIG. 14 schematically illustrates another exemplary memory module in which a DQS pin of a first memory device is connected to a DQS pin of a second memory device.

A second problem may also arise from tying together two output signal pins. FIG. 14 schematically illustrates another exemplary memory module 305 in which a first DQS pin 312 of a first memory device 310 is electrically connected to a second DQS pin 322 of a second memory device 320. The two DQS pins 312, 322 of FIG. 14 are both electrically connected to a memory controller (not shown). The DQ (data input/output) pin 314 of the first memory device 310 and the corresponding DQ pin 324 of the second memory device 320 are each electrically connected to the memory controller by the DQ bus (not shown). Typically, each memory device 310, 320 will have a plurality of DQ pins (e.g., eight DQ pins per memory device), but for simplicity, FIG. 14 only shows one DQ pin for each memory device 310, 320.

Each of the memory devices 310, 320 of FIG. 14 utilizes a respective on-die termination or "ODT" circuit 332, 334 which has termination resistors (e.g., 75 ohms) internal to the memory devices 310, 320 to provide signal termination. Each memory device 310, 320 has a corresponding ODT signal pin 362, 364 which is electrically connected to the memory controller via an ODT bus 340. The ODT signal pin 362 of the first memory device 310 receives a signal from the ODT bus 340 and provides the signal to the ODT circuit 332 of the first memory device 310. The ODT circuit 332 responds to the signal by selectively enabling or disabling the internal termination resistors 352, 356 of the first memory device 310. This behavior is shown schematically in FIG. 14 by the switches 342, 344 which are either closed (dash-dot line) or opened (solid line). The ODT signal pin 364 of the second memory device 320 receives a signal from the ODT bus 340 and provides the signal to the ODT circuit 334 of the second memory device 320. The ODT circuit 334 responds to the signal by selectively enabling or disabling the internal termination resistors 354, 358 of the second memory device 320. This behavior is shown schematically in FIG. 14 by the switches 346, 348 which are either closed (dash-dot line) or opened (solid line). The switches 342, 344, 346, 348 of FIG. 14 are schematic representations of the operation of the ODT circuits 332, 334, and do not signify that the ODT circuits 332, 334 necessarily include mechanical switches.

Examples of memory devices 310, 320 which include such ODT circuits 332, 334 include, but are not limited to, DDR2 memory devices. Such memory devices are configured to selectively enable or disable the termination of the memory device in this way in response to signals applied to the ODT signal pin of the memory device. For example, when the ODT signal pin 362 of the first memory device 310 is pulled high, the termination resistors 352, 356 of the first memory device 310 are enabled. When the ODT signal pin 362 of the first memory device 310 is pulled low (e.g., grounded), the termination resistors 352, 356 of the first memory device 310 are disabled. By selectively disabling the termination resistors of an active memory device, while leaving the termination resistors of inactive memory devices enabled, such configurations advantageously preserve signal strength on the active memory device while continuing to eliminate signal reflections at the bus-die interface of the inactive memory devices.

In certain configurations, as schematically illustrated by FIG. 14, the DQS pins 312, 322 of each memory device 310, 320 are selectively connected to a voltage VTT through a corresponding termination resistor 352, 354 internal to the corresponding memory device 310, 320. Similarly, in certain configurations, as schematically illustrated by FIG. 14, the DQ pins 314, 324 are selectively connected to a voltage VTT through a corresponding termination resistor 356, 358 internal to the corresponding memory device 310, 320. In certain configurations, rather than being connected to a voltage VTT, the DQ pins 314, 324 and/or the DQS pins 312, 322 are selectively connected to ground through the corresponding termination resistors 352, 354, 356, 358. The resistances of the internal termination resistors 352, 354, 356, 358 are selected to clamp the voltages so as to reduce the signal reflections from the corresponding pins. In the configuration schematically illustrated by FIG. 14, each internal termination resistor 352, 354, 356, 358 has a resistance of approximately 75 ohms.

When connecting the first memory device 310 and the second memory device 320 together to form a double word width, both the first memory device 310 and the second memory device 320 are, enabled at the sametime (egg., by a common CS signal). Connecting the first memory device 310 and the second memory device 320 by tying the DQS pins 312, 322 together, as shown in FIG. 14, results in a reduced effective termination resistance for the DQS pins 312, 322. For example, for the exemplary configuration of FIG. 14, the effective termination resistance for the DQS pins 312, 322 is approximately 37.5 ohms, which is one-half the desired ODT resistance (for 75-ohm internal termination resistors) to reduce signal reflections since the internal termination resistors 352, 354 of the two memory devices 310, 320 are connected in parallel. This reduction in the termination resistance can result in signal reflections causing the memory device to malfunction.

Figure 15A:
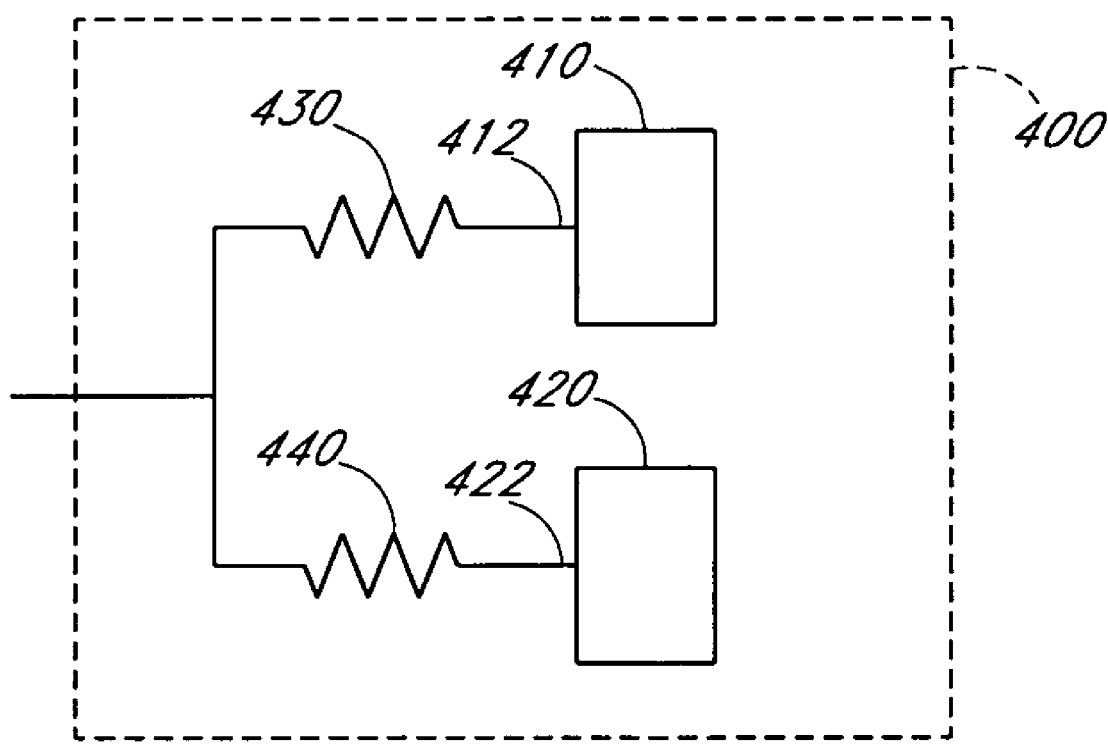
FIG. 15 schematically illustrates an exemplary memory module in accordance with certain embodiments described herein.

FIG. 15 schematically illustrates an exemplary memory module 400 in accordance with certain embodiments described herein. The memory module 400 comprises a first memory device 410 having a first data strobe (DQS) pin 412 and a second memory device 420 having a second data strobe (DQS) pin 422. The memory module 400 further comprises a first resistor 430 electrically coupled to the first DQS pin 412. The memory module 400 further comprises a second resistor 440 electrically coupled to the second DQS pin 422 and to the first resistor 430. The first DQS pin 412 is electrically coupled to the second DQS pin 422 through the first resistor 430 and through the second resistor 440.

Figure 16A:
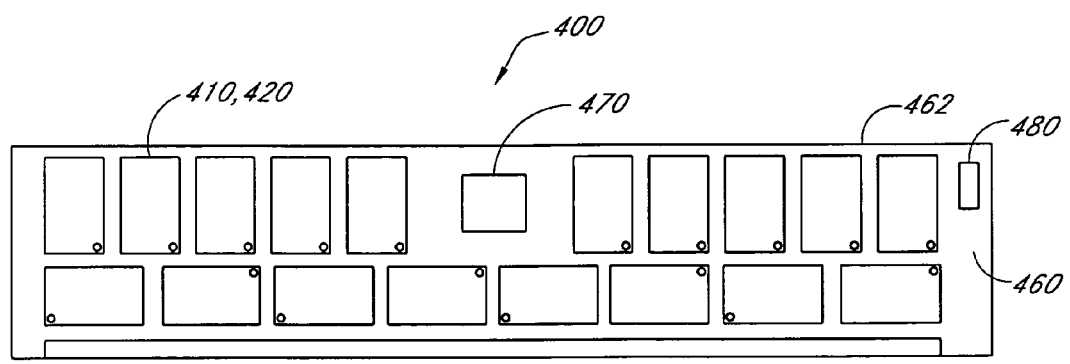
FIGS. 16A and 16B schematically illustrate a first side and a second side, respectively, of a memory module with eighteen 64M×4 bit, DDR-1 SDRAM FBGA memory devices on each side of a 184-pin glass-epoxy printed circuit board.
Figure 16B:
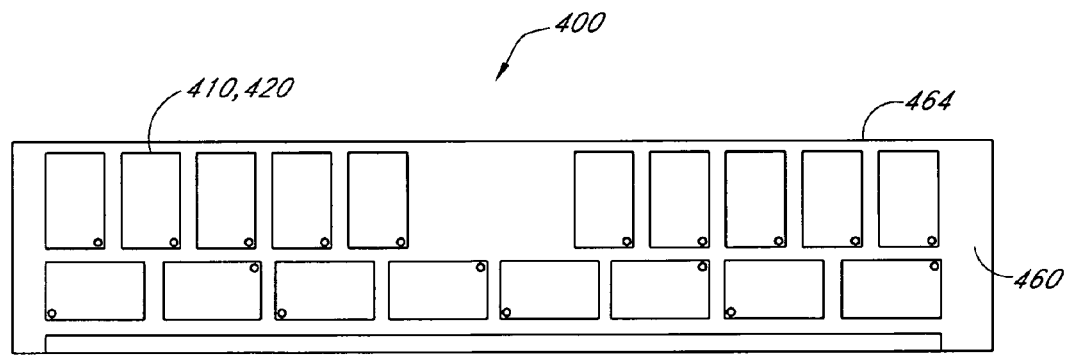

In certain embodiments, the memory module 400 is a 1-GB unbuffered Double Data Rate (DDR) Synchronous Dynamic RAM (SDRAM) high-density dual in-line memory module (DIMM). FIGS. 16A and 16B schematically illustrate a first side 462 and a second side 464, respectively, of such a memory module 400 with eighteen 64M×4-bit, DDR-1 SDRAM FBGA memory devices on each side of a 184-pin glass-epoxy printed circuit board (PCB) 460. In certain embodiments, the memory module 400 further comprises a phase-lock-loop (PLL) clock driver 470, an EEPROM for serial-presence detect (SPD) data 480, and decoupling capacitors (not shown) mounted on the PCB in parallel to suppress switching noise on VDD and VDDQ power supply for DDR-1 SDRAM. By using synchronous design, such memory modules 400 allow precise control of data transfer between the memory module 400 and the system controller. Data transfer can take place on both edges of the DQS signal at various operating frequencies and programming latencies. Therefore, certain such memory modules 400 are suitable for a variety of high-performance system applications.

In certain embodiments, the memory module 400 comprises a plurality of memory devices configured in pairs, each pair having a first memory device 410 and a second memory device 420. For example, in certain embodiments, a 128M× 72-bit DDR SDRAM high-density memory module 400 comprises thirty-six 64M×4-bit DDR-1 SDRAM integrated circuits in FBGA packages configured in eighteen pairs. The first memory device 410 of each pair has the first DQS pin 412 electrically coupled to the second DQS pin 422 of the second memory device 420 of the pair. In addition, the first DQS pin 412 and the second DQS pin 422 are concurrently active when the first memory device 410 and the second memory device 420 are concurrently enabled.

In certain embodiments, the first resistor 430 and the second resistor 440 each has a resistance advantageously selected to reduce the current flow between the first DQS pin 412 and the second DQS pin 422 while allowing signals to propagate between the memory controller and the DQS pins 412, 422. In certain embodiments, each of the first resistor 430 and the second resistor 440 has a resistance in a range between approximately 5 ohms and approximately 50 ohms. For example, in certain embodiments, each of the first resistor 430 and the second resistor 440 has a resistance of approximately 22 ohms. Other resistance values for the first resistor 430 and the second resistor 440 are also compatible with embodiments described herein. In certain embodiments, the first resistor 430 comprises a single resistor, while in other embodiments, the first resistor 430 comprises a plurality of resistors electrically coupled together in series and/or in parallel. Similarly, in certain embodiments, the second resistor 440 comprises a single resistor, while in other embodiments, the second resistor 440 comprises a plurality of resistors electrically coupled together in series and/or in parallel.

Figure 17A:
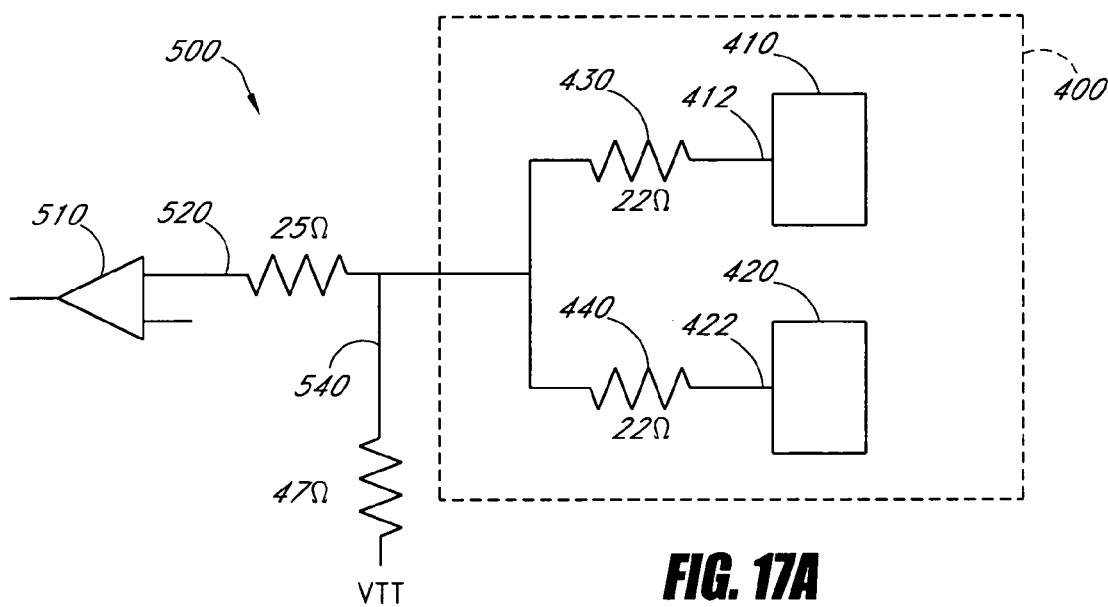
FIGS. 17A and 17B schematically illustrate an exemplary embodiment of a memory module in which a first resistor and a second resistor are used to reduce the current flow between the first DQS pin and the second DQS pin.
Figure 17B:
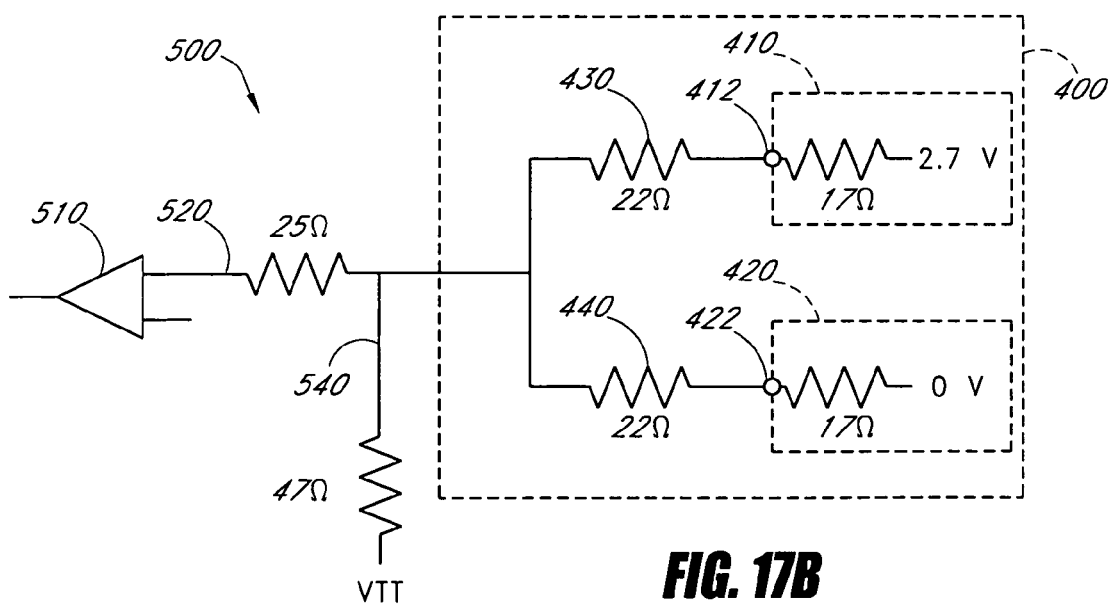

FIGS. 17A and 17B schematically illustrate an exemplary embodiment of a memory module 400 in which the first resistor 430 and the second resistor 440 are used to reduce the current flow between the first DQS pin 412 and the second DQS pin 422. As schematically illustrated by FIG. 17A, the memory module 400 is part of a computer system 500 having a memory controller 510. The first resistor 430 has a resistance of approximately 22 ohms and the second resistor 440 has a resistance of approximately 22 ohms. The first resistor 430 and the second resistor 440 are, electrically coupled in parallel to the memory controller 510 through a signal line 520 having a resistance of approximately 25 ohms. The first resistor 430 and the second resistor 440 are also electrically coupled in parallel to a source of a fixed termination voltage (identified by VTT in FIGS. 17A and 17B) by a signal line 540 having a resistance of approximately 47 ohms. Such an embodiment can advantageously be used to allow two memory devices having lower bit widths (e.g., 4-bit) to behave as a single virtual memory device having a higher bit width (e.g., 8-bit).

FIG. 17B schematically illustrates exemplary current-limiting resistors 430, 440 in conjunction with the impedances of the memory devices 410, 420. During an exemplary portion of a data read operation, the memory controller 510 is in a high-impedance condition, the first memory device 410 drives the first DQS pin 412 high (e.g., 2.7 volts), and the second memory device 420 drives the second DQS pin 422 low (e.g., 0 volts). The amount of time for which this condition occurs is approximated by the time between $t_2$ and $t_3$ of FIG. 13, which in certain embodiments is approximately twice the tDQSQ (data strobe edge to output data edge skew time, e.g., approximately 0.8 nanoseconds). At least a portion of this time in certain embodiments is caused by simultaneous switching output (SSO) effects.

In certain embodiments, as schematically illustrated by FIG. 17B, the DQS driver of the first memory device 410 has a driver impedance $R_1$ of approximately 17 ohms, and the DQS driver of the second memory device 420 has a driver impedance $R_4$ of approximately 17 ohms. Because the upper network of the first memory device 410 and the first resistor 430 (with a resistance $R_2$ of approximately 22 ohms) is approximately equal to the lower network of the second memory device 420 and the second resistor 440 (with a resistance $R_3$ of approximately 22 ohms), the voltage at the midpoint is approximately 0.5*(2.7−0)=1.35 volts, which equals VTT, such that the current flow across the 47-ohm resistor of FIG. 17B is approximately zero.

The voltage at the second DQS pin 422 in FIG. 17B is given by $V_{DQS2}=2.7*R_4/(R_1+R_2+R_3+R_4)=0.59$ volts and the current flowing through the second DQS pin 422 is given by $I_{DQS2}=0.59/R_4=34$ milliamps. The power dissipation in the DQS driver of the second memory device 420 is thus $P_{DQS2}=34$ mA*0.59 V=20 milliwatts. In contrast, without the first resistor 430 and the second resistor 440, only the 17-ohm impedances of the two memory devices 410, 420 would limit the current flow between the two DQS pins 412, 422, and the power dissipation in the DQS driver of the second memory device 420 would be approximately 107 milliwatts. Therefore, the first resistor 430 and the second resistor 440 of FIGS. 17A and 17B advantageously limit the current flowing between the two memory devices during the time that the DQS pin of one memory device is driven high and the DQS pin of the other memory device is driven low.

In certain embodiments in which there is overshoot or undershoot of the voltages, the amount of current flow can be higher than those expected for nominal voltage values. Therefore, in certain embodiments, the resistances of the first resistor 430 and the second resistor 440 are advantageously selected to account for such overshoot/undershoot of voltages.

For certain such embodiments in which the voltage at the second DQS pin 422 is $V_{DQS2}=0.59$ volts and the duration of the overdrive condition is approximately 0.8 nanoseconds at maximum, the total surge is approximately 0.59 V*1.2 ns=0.3 V-ns. For comparison, the JEDEC standard for overshoot/undershoot is 2.4 V-ns, so certain embodiments described herein advantageously keep the total surge within predetermined standards (e.g., JEDEC standards).

Figure 18:
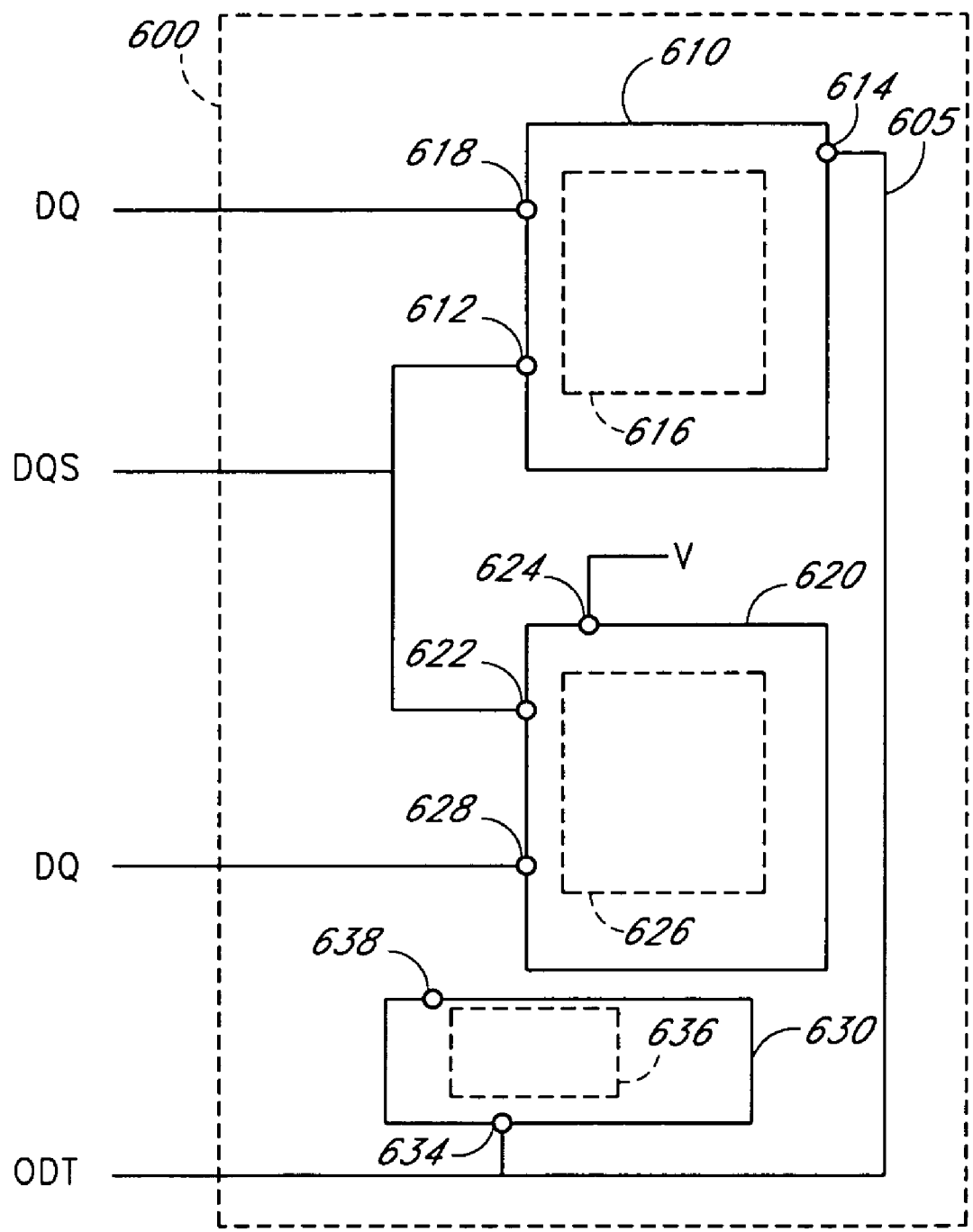
FIG. 18 schematically illustrates another exemplary memory module compatible with certain embodiments described herein.

FIG. 18 schematically illustrates another exemplary memory module 600 compatible with certain embodiments described herein. The memory module 600 comprises a termination bus 605. The memory module 600 further comprises a first memory device 610 having a first data strobe pin 612, a first termination signal pin 614 electrically coupled to the termination bus 605, a first termination circuit 616, and at least one data pin 618. The first termination circuit 616 selectively electrically terminating the first data strobe pin 612 and the first data pin 618 in response to a first signal received by the first termination signal pin 614 from the termination bus 605. The memory module 600 further comprises a second memory device 620 having a second data strobe pin 622 electrically coupled to the first data strobe pin 612, a second termination signal pin 624, a second termination circuit 626, and at least one data pin 628. The second termination signal pin 624 is electrically coupled to a voltage, wherein the second termination circuit 626 is responsive to the voltage by not terminating the second data strobe pin 622 or the second data pin 628. The memory module 600 further comprises at least one termination assembly 630 having a third termination signal pin 634, a third termination circuit 636, and at least one termination pin 638 electrically coupled to the data pin 628 of the second memory device 620. The third termination signal pin 634 is electrically coupled to the termination bus 605. The third termination circuit 636 selectively electrically terminates the data pin 628 of the second memory device 620 through the termination pin 638 in response to a second signal received by the third termination signal pin 634 from the termination bus 605.

Figure 19:
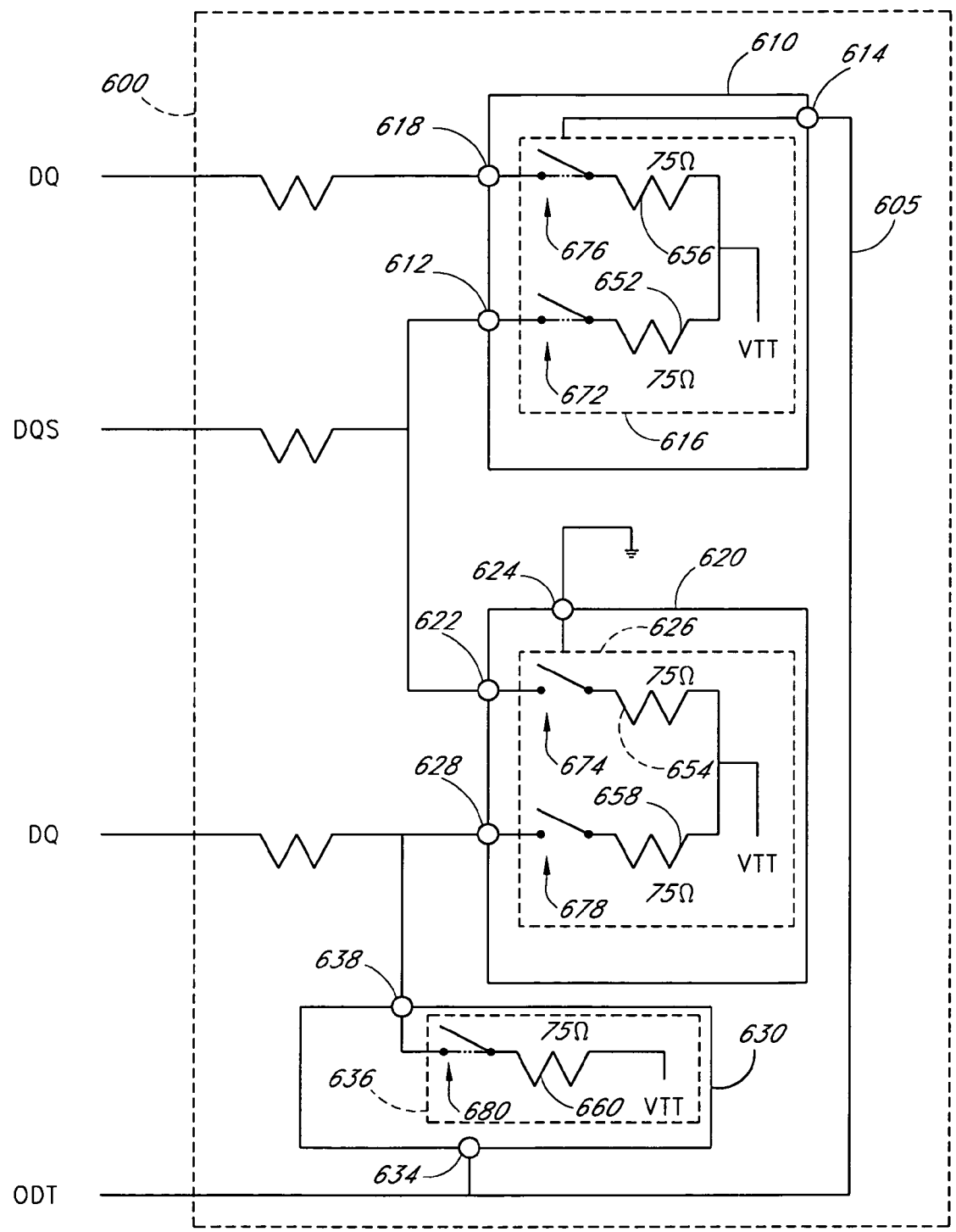
FIG. 19 schematically illustrates a particular embodiment of the memory module schematically illustrated by FIG. 18.

FIG. 19 schematically illustrates a particular embodiment of the memory module 600 schematically illustrated by FIG. 18. The memory module 600 comprises an on-die termination (ODT) bus 605. The memory module 600 comprises a first memory device 610 having a first data strobe (DQS) pin 612, a first ODT signal pin 614 electrically coupled to the ODT bus 605, a first ODT circuit 616, and at least one data (DQ) pin 618. The first ODT circuit 616 selectively electrically terminates the first DQS pin 612 and the DQ pin 618 of the first memory device 610 in response to an ODT signal received by the first ODT signal pin 614 from the ODT bus 605. This behavior of the first ODT circuit 616 is schematically illustrated in FIG. 14 by the switches 672, 676 which are selectively closed (dash-dot line) or opened (solid line).

The memory module 600 further comprises a second memory device 620 having a second DQS pin 622 electrically coupled to the first DQS pin 612, a second ODT signal pin 624, a second ODT circuit 626, and at least one DQ pin 628. The first DQS pin 612 and the second DQS pin 622 are concurrently active when the first memory device 610 and the second memory device 620 are concurrently enabled. The second ODT signal pin 624 is electrically coupled to a voltage (e.g., ground), wherein the second ODT circuit 626 is responsive to the voltage by not terminating the second DQS pin 622 or the second DQ pin 624. This behavior of the second ODT circuit 626 is schematically illustrated in FIG. 14 by the switches 674, 678 which are opened.

The memory module 600 further comprises at least one termination assembly 630 having a third ODT signal pin 634 electrically coupled to the ODT bus 605, a third ODT circuit 636, and at least one termination pin 638 electrically coupled to the DQ pin 628 of the second memory device 620. The third ODT circuit 636 selectively electrically terminates the DQ pin 628 of the second memory device 620 through the termination pin 638 in response to an ODT signal received by the third ODT signal pin 634 from the ODT bus 605. This behavior of the third ODT circuit 636 is schematically illustrated in FIG. 19 by the switch 680 which is either closed (dash-dot line) or opened (solid line).

In certain embodiments, the termination assembly 630 comprises discrete electrical components which are surface-mounted or embedded on the printed-circuit board of the memory module 600. In certain other embodiments, the termination assembly 630 comprises an integrated circuit mounted on the printed-circuit board of the memory module 600. Persons skilled in the art can provide a termination assembly 630 in accordance with embodiments described herein.

Certain embodiments of the memory module 600 schematically illustrated by FIG. 19 advantageously avoid the problem schematically illustrated by FIG. 12 of electrically connecting the internal termination resistances of the DQS pins of the two memory devices in parallel. As described above in relation to FIG. 14, FIGS. 18 and 19 only show one DQ pin for each memory device for simplicity. Other embodiments have a plurality of DQ pins for each memory device. In certain embodiments, each of the first ODT circuit 616, the second ODT circuit 626, and the third ODT circuit 636 are responsive to a high voltage or signal level by enabling the corresponding termination resistors and are responsive to a low voltage or signal level (e.g., ground) by disabling the corresponding termination resistors. In other embodiments, each of the first ODT circuit 616, the second ODT circuit 626, and the third ODT circuit 636 are responsive to a high voltage or signal level by disabling the corresponding termination resistors and are responsive to a low voltage or signal level (e.g., ground) by enabling the corresponding termination resistors. Furthermore, the switches 672, 674, 676, 678, 680 of FIG. 18 are schematic representations of the enabling and disabling operation of the ODT circuits 616, 626, 636 and do not signify that the ODT circuits 616, 626, 636 necessarily include mechanical switches.

The first ODT signal pin 614 of the first memory device 610 receives an ODT signal from the ODT bus 605. In response to this ODT signal, the first ODT circuit 616 selectively enables or disables the termination resistance for both the first DQS pin 612 and the DQ pin 618 of the first memory device 610. The second ODT signal pin 624 of the second memory device 620 is tied (e.g., directly hard-wired) to the voltage (e.g., ground), thereby disabling the internal termination resistors 654, 658 on the second DQS pin 622 and the second DQ pin 628, respectively, of the second memory device 620 (schematically shown by open switches 674, 678 in FIG. 19). The second DQS pin 622 is electrically coupled to the first DQS pin 612, so the termination resistance for both the first DQS pin 612 and the second DQS pin 622 is provided by the termination resistor 652 internal to the first memory device 510.

The termination resistor 656 of the DQ pin 618 of the first memory device 610 is enabled or disabled by the ODT signal received by the first ODT signal pin 614 of the first memory device 610 from the ODT bus 605. The termination resistance of the DQ pin 628 of the second memory device 620 is enabled or disabled by the ODT signal received by the third ODT signal pin 634 of the termination assembly 630 which is external to the second memory device 620. Thus, in certain embodiments, the first ODT signal pin 614 and the third ODT signal pin 634 receive the same ODT signal from the ODT bus 605, and the termination resistances for both the first memory device 610 and the second memory device 620 are selectively enabled or disabled in response thereto when these memory devices are concurrently enabled. In this way, certain embodiments of the memory module 600 schematically illustrated by FIG. 19 provides external or off-chip termination of the second memory device 620.

Certain embodiments of the memory module 600 schematically illustrated by FIG. 19 advantageously allow the use of two lower-cost readily-available 512-Mb DDR-2 SDRAM devices to provide the capabilities of a more expensive 1-GB DDR-2 SDRAM device. Certain such embodiments advantageously reduce the total cost of the resultant memory module 600.

Certain embodiments described herein advantageously increase the memory capacity or memory density per memory slot or socket on the system board of the computer system. Certain embodiments advantageously allow for higher memory capacity in systems with limited memory slots. Certain embodiments advantageously allow for flexibility in system board design by allowing the memory module 10 to be used with computer systems designed for different numbers of ranks (e.g., either with computer systems designed for two-rank memory modules or with computer systems designed for four-rank memory modules). Certain embodiments advantageously provide lower costs of board designs.

In certain embodiments, the memory density of a memory module is advantageously doubled by providing twice as many memory devices as would otherwise be provided. For example, pairs of lower-density memory devices can be substituted for individual higher-density memory devices to reduce costs or to increase performance. As another example, twice the number of memory devices can be used to produce a higher-density memory configuration of the memory module. Each of these examples can be limited by the number of chip select signals which are available from the memory controller or by the size of the memory devices. Certain embodiments described herein advantageously provide a logic mechanism to overcome such limitations.

Various embodiments of the present invention have been described above. Although this invention has been described with reference to these specific embodiments, the descriptions are intended to be illustrative of the invention and are not intended to be limiting. Various modifications and applications may occur to those skilled in the art without departing from the true spirit and scope of the invention.

What is claimed is:

1. A memory module comprising:
   a plurality of memory devices, each memory device having a corresponding load; and
   a circuit electrically coupled to the plurality of memory devices and configured to be electrically coupled to a memory controller of a computer system, the circuit selectively isolating one or more of the loads of the memory devices from the computer system, the circuit comprising logic which translates between a system memory domain of the computer system and a physical memory domain of the memory module, wherein the system memory domain is compatible with a first number of chip selects, and the physical memory domain is compatible with a second number of chip selects equal to twice the first number of chip selects.

2. The memory module of claim 1, wherein the circuit comprises a logic element selected from a group consisting of: a programmable-logic device (PLD), an application-specific integrated circuit (ASIC), a field-programmable gate array (FPGA), a custom-designed semiconductor device, and a complex programmable-logic device (CPLD).

3. The memory module of claim 2, wherein the circuit further comprises one or more switches operatively coupled to the logic element to receive control signals from the logic element.

4. The memory module of claim 1, wherein the plurality of memory devices has a first number of memory devices, and the circuit selectively isolates the loads of a second number of the memory devices from the computer system, the second number less than the first number.

5. The memory module of claim 4, wherein the first number of memory devices are configured in a plurality of ranks, and wherein the second number of memory devices are configured as one rank of the plurality of ranks.

6. The memory module of claim 1, wherein the logic translates address signals in the system memory domain to address signals in the physical memory domain.

7. The memory module of claim 1, wherein the plurality of memory devices are arranged in one or more ranks and the system memory domain is compatible to a first memory density per rank, and the physical memory domain is compatible with a second memory density per rank equal to twice the first memory density per rank.

8. The memory module of claim 1, wherein the plurality of memory devices comprises a pair of memory devices, each memory device of the pair having a first memory capacity, the pair of memory devices configured to simulate a memory device having a second memory capacity equal to twice the first memory capacity.

9. The memory module of claim 1, wherein the memory module comprises a dual inline memory module.

10. The memory module of claim 9, wherein the memory module comprises a rank-buffered dual inline memory module.

11. The memory module of claim 1, wherein the memory module comprises a DDR2 SDRAM memory array.

12. The memory module of claim 1, wherein the circuit selectively isolates the loads of the memory devices from the computer system in response to a command or address signal received from the computer system.

13. A method of using a memory module with a computer system, the method comprising:
   providing a memory module having a plurality of memory devices and a circuit electrically coupled to the plurality of memory devices, the circuit configured to be electrically coupled to a computer system, each memory device having a corresponding load;
   electrically coupling the memory module to the computer system; and
   activating the circuit to selectively isolate at least one of the loads of the memory devices from the computer system and to translate between a system memory domain of the computer system and a physical memory domain of the memory module, wherein the system memory domain is compatible with a first number of chip selects, and the physical memory domain is compatible with a second number of chip selects equal to twice the first number of chip selects.

14. The method of claim 13, wherein the plurality of memory devices comprises a pair of memory devices, each memory device of the pair having a first memory capacity, the pair of memory devices configured to simulate a memory device having a second memory capacity equal to twice the first memory capacity.

15. The method of claim 13, wherein the logic translates address signals in the system memory domain to address signals in the physical memory domain.

16. The method of claim 13, wherein the plurality of memory devices are arranged in one or more ranks and the system memory domain is compatible to a first memory density per rank, and the physical memory domain is compatible with a second memory density per rank equal to twice the first memory density per rank.

17. The method of claim 13, wherein the memory module comprises a dual inline memory module.

18. A memory module connectable to a computer system, the memory module comprising:
   a first memory device having a first data signal line and a first data strobe signal line;
   a second memory device having a second data signal line and a second data strobe signal line;
   a common data signal line connectable to the computer system; and
   a device electrically coupled to the first data signal line, to the second data signal line, and to the common data signal line, the device selectively electrically coupling the first data signal line to the common data signal line and selectively electrically coupling the second data signal line to the common data signal line, the device comprising logic which translates between a system memory domain of the computer system and a physical memory domain of the memory module, wherein the system memory domain is compatible with a first number of chip selects, and the physical memory domain is compatible with a second number of chip selects equal to twice the first, number of chip selects.

19. The memory module of claim 18, wherein the device comprises a logic element.

20. The memory module of claim 19, wherein the logic element is selected from the group consisting of: an application-specific integrated circuit, a custom-programmable logic device, and a field-programmable gate array.

21. The memory module of claim 18, wherein the device selectively electrically couples the first data signal line to the common data signal line and selectively electrically couples the second data signal line to the common data signal line.

22. The memory module of claim 18, wherein the memory module further comprises a common data strobe signal line connectable to the computer system, the device electrically coupled to the first data strobe signal line, to the second data strobe signal line, and to the common data strobe signal line, the device selectively electrically coupling the first data strobe signal line to the common data strobe signal line and selectively electrically coupling the second data strobe signal line to the common data strobe signal line.

23. The memory module of claim 22, wherein the device selectively electrically couples the first data strobe signal line to the common data strobe signal line and selectively electrically couples the second data strobe signal line to the common data strobe signal line.

24. A memory module comprising:
a plurality of memory devices arranged in one or more ranks, each memory device having a corresponding load; and
a circuit electrically coupled to the plurality of memory devices and configured to be electrically coupled to a memory controller of a computer system, the circuit selectively isolating one or more of the loads of the memory devices from the computer system, the circuit comprising logic which translates between a system memory domain of the computer system and a physical memory domain of the memory module, wherein the system memory domain is compatible to a first memory density per rank, and the physical memory domain is compatible with a second memory density per rank equal to twice the first memory density per rank.

25. The memory module of claim 24, wherein the circuit comprises a logic element selected from a group consisting of: a programmable-logic device (PLD), an application-specific integrated circuit (ASIC), a field-programmable gate array (FPGA), a custom-designed semiconductor device, and a complex programmable-logic device (CPLD).

26. The memory module of claim 25, wherein the circuit further comprises one or more switches operatively coupled to the logic element to receive control signals from the logic element.

27. The memory module of claim 24, wherein the plurality of memory devices has a first number of memory devices, and the circuit selectively isolates the loads of a second number of the memory devices from the computer system, the second number less than the first number.

28. The memory module of claim 27, wherein the first number of memory devices are configured in a plurality of ranks, and wherein the second number of memory devices are configured as one rank of the plurality of ranks.

29. The memory module of claim 24, wherein the logic translates address signals in the system memory domain to address signals in the physical memory domain.

30. The memory module of claim 24, wherein the plurality of memory devices comprises a pair of memory devices, each memory device of the pair having a first memory capacity, the pair of memory devices configured to simulate a memory device having a second memory capacity equal to twice the first memory capacity.

31. The memory module of claim 24, wherein the memory module comprises a dual inline memory module.

32. The memory module of claim 31, wherein the memory module comprises a rank-buffered dual inline memory module.

33. The memory module of claim 24, wherein the memory module comprises a DDR2 SDRAM memory array.

34. The memory module of claim 24, wherein the circuit selectively isolates the loads of the memory devices from the computer system in response to a command or address signal received from the computer system.

35. A method of using a memory module with a computer system, the method comprising:
providing a memory module having a plurality of memory devices arranged in one or more ranks and a circuit electrically coupled to the plurality of memory devices, the circuit configured to be electrically coupled to a computer system, each memory device having a corresponding load;
electrically coupling the memory module to the computer system; and
activating the circuit to selectively isolate at least one of the loads of the memory devices from the computer system and to translate between a system memory domain of the computer system and a physical memory domain of the memory module, wherein the system memory domain is compatible to a first memory density per rank, and the physical memory domain is compatible with a second memory density per rank equal to twice the first memory density per rank.

36. The method of claim 35, wherein the plurality of memory devices comprises a pair of memory devices, each memory device of the pair having a first memory capacity, the pair of memory devices configured to simulate a memory device having a second memory capacity equal to twice the first memory capacity.

37. The method of claim 35, wherein the logic translates address signals in the system memory domain to address signals in the physical memory domain.

38. The method of claim 35, wherein the memory module comprises a dual inline memory module.

39. A memory module connectable to a computer system, the memory module comprising:
a first memory device having a first data signal line and a first data strobe signal line;
a second memory device having a second data signal line and a second data strobe signal line;
a common data signal line connectable to the computer system; and
a device electrically coupled to the first data signal line, to the second data signal line, and to the common data signal line, the device selectively electrically coupling the first data signal line to the common data signal line and selectively electrically coupling the second data signal line to the common data signal line, the device comprising logic which translates between a system memory domain of the computer system and a physical memory domain of the memory module, wherein the system memory domain is compatible to a first memory density per memory device, and the physical memory domain is compatible with a second memory density per memory device equal to twice the first memory density per memory device.

40. The memory module of claim 39, wherein the device comprises a logic element.

41. The memory module of claim 39, wherein the device selectively electrically couples the first data signal line to the common data signal line and selectively electrically couples the second data signal line to the common data signal line.

42. The memory module of claim 41, wherein the logic element is selected from the group consisting of: an application-specific integrated circuit, a custom-programmable logic device, and a field-programmable gate array.

43. The memory module of claim 39, wherein the memory module further comprises a common data strobe signal line connectable to the computer system, the device electrically coupled to the first data strobe signal line, to the second data strobe signal line, and to the common data strobe signal line, the device selectively electrically coupling the first data strobe signal line to the common data strobe signal line and selectively electrically coupling the second data strobe signal line to the common data strobe signal line.

44. The memory module of claim 43, wherein the device selectively electrically couples the first data strobe signal line to the common data strobe signal line and selectively electrically couples the second data strobe signal line to the common data strobe signal line.

* * * * *

UNITED STATES PATENT AND TRADEMARK OFFICE
CERTIFICATE OF CORRECTION

PATENT NO. : 7,532,537 B2 Page 1 of 1
APPLICATION NO. : 11/335875
DATED : May 12, 2009
INVENTOR(S) : Jeffrey C. Solomon and Jayesh R. Bhakta It is certified that error appears in the above-identified patent and that said Letters Patent is hereby corrected as shown below:

At page 2, column 1, line 49, Change "fourbanks," to --four banks,--.

At page 5, column 3, line 52, Change "the, computer" to --the computer--.

At page 9, column 6, line 30, Change "30a30b" to --30a, 30b--.

At page 20, column 15, line 13, Change "plurality-of" to --plurality of--.

At page 23, column 17, line 3, Change "($CS_0$-$CS_1$)" to --($CS_0$, $CS_1$)--.

At page 41, column 33, line 25-26, Change "128M×8-bit-memory" to --128M×8-bit memory--.

At page 45, column 36, line 2, Change "are, enabled" to --are enabled--.

At page 45, column 36, line 2, Change "(egg.," to --(e.g.,--.

At page 47, column 37, line 23, Change "are, electrically" to --are electrically--.

At page 5, column 42, line 49, In Claim 18, change "first, number" to --first number--.

Signed and Sealed this

Sixteenth Day of March, 2010

David J. Kappos
*Director of the United States Patent and Trademark Office*